United States Patent

Tanaka

[19]

[11] Patent Number: 6,002,523
[45] Date of Patent: Dec. 14, 1999

[54] LASER ILLUMINATION METHOD

[75] Inventor: Koichiro Tanaka, Kanagawa, Japan

[73] Assignee: Semiconductor Energy Laboratory Co., Ltd., Kanagawa-ken, Japan

[21] Appl. No.: 09/163,296

[22] Filed: Sep. 29, 1998

[30] Foreign Application Priority Data

Sep. 30, 1997 [JP] Japan .................................. 9-282566

[51] Int. Cl.$^6$ .......................... G20B 27/10; G20B 13/08
[52] U.S. Cl. ........................................... 359/624; 359/668
[58] Field of Search .................................. 359/619–624, 359/668

[56] References Cited

U.S. PATENT DOCUMENTS

| | | | |
|---|---|---|---|
| 5,095,386 | 3/1992 | Scheibengraber | 359/668 |
| 5,796,521 | 8/1998 | Kahlert et al. | 359/619 |
| 5,844,727 | 12/1998 | Partlo | 359/710 |
| 5,897,799 | 4/1999 | Yamazaki et al. | 219/121.75 |
| 5,900,980 | 5/1999 | Yamazaki et al. | 359/619 |

FOREIGN PATENT DOCUMENTS 5-175235   7/1993   Japan .

*Primary Examiner*—Georgia Epps
*Assistant Examiner*—David N. Spector
*Attorney, Agent, or Firm*—Fish & Richardson P.C.

[57] ABSTRACT

A beam homogenizer at least includes a first optical lens for dividing a light beam into N(n'−1) beams in a vertical direction, a second optical lens for dividing the light beam into (2n+1) beams in a horizontal direction, a third optical lens for recombining the beams that are divided in the vertical and horizontal directions into (n'−1) beams while superimposing the (n'−1) beams so that they are deviated from each other in the horizontal direction, and a fourth optical lens for recombining the beams that are divided in the vertical direction.

56 Claims, 15 Drawing Sheets

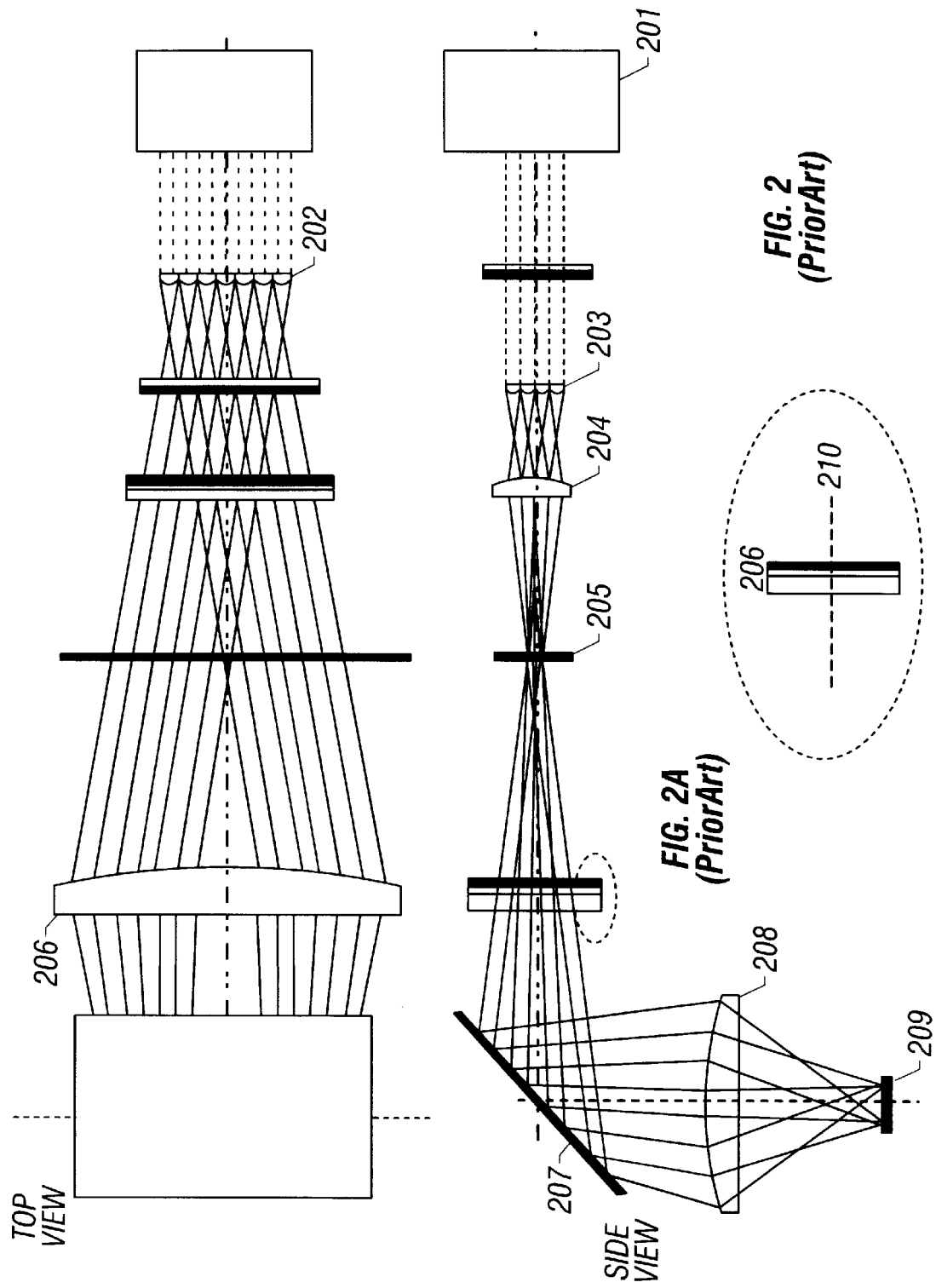

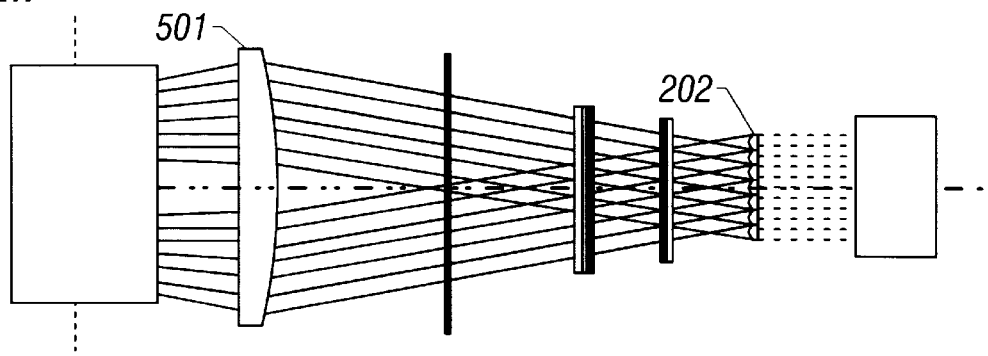
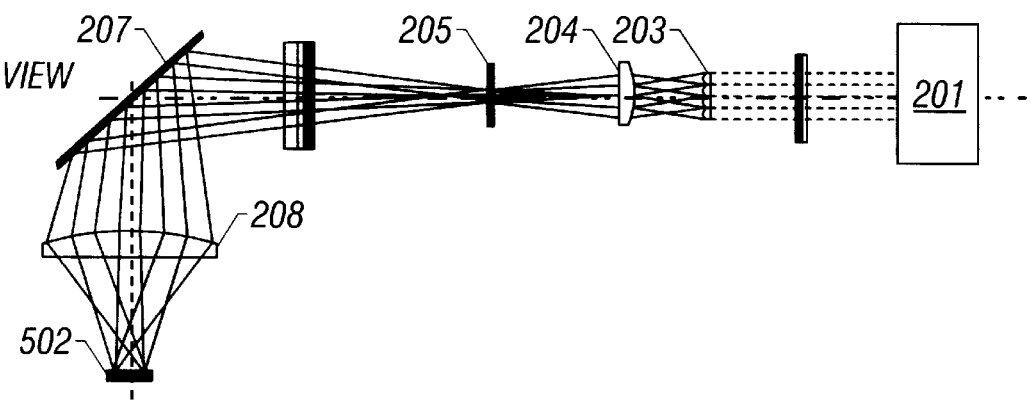
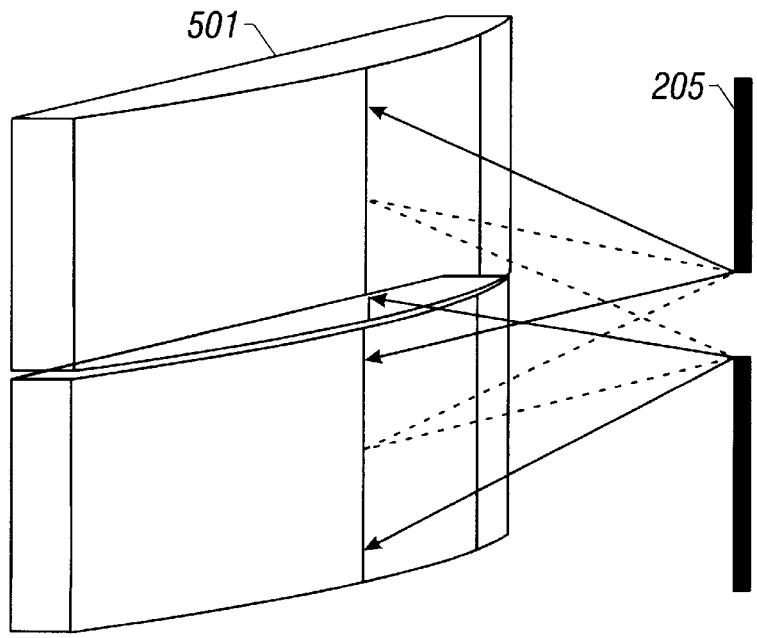
FIG. 5

LASER ILLUMINATION METHOD

FIELD OF THE INVENTION

The present invention relates to a technique capable of applying a laser beam to a large area with a high degree of uniformity as well as an application method of that technique.

BACKGROUND OF THE INVENTION

In recent years, extensive studies have been made of techniques of crystallizing an amorphous semiconductor film or improving the crystallinity of a crystalline semiconductor film (i.e., a non-single-crystal semiconductor film that is polycrystalline, microcrystalline or of like crystallinity) formed on an insulating substrate such as a glass substrate by subjecting it to laser annealing. A typical example of such a semiconductor film is a silicon film.

Glass substrates are advantageous over quartz substrates that have widely been used conventionally in that they are nexpensive and high in workability and can easily provide a large-area substrate. This is the reason why the above studied have been made. The reason why lasers are used favorably in crystallization is that glass substrates have low melting points. Lasers can apply high energy to only a non-single-crystal film without changing the temperature of a substrate to a large extent.

Having high mobility, crystalline silicon films that are formed by laser annealing are widely used in monolithic liquid crystal electro-optical devices and the like in which pixel-driving TFTs (thin-film transistors) and driver circuit TFTs, for instance, are formed on a single glass substrate by using such a crystalline silicon film. Since a crystalline silicon film formed by laser annealing is constituted of a number of crystal grains, it is called a polysilicon film or a polycrystalline semiconductor film.

A laser annealing method in which a pulse laser beam emitted from a large output power excimer laser or the like is processed by an optical system so as to be shaped into a several centimeters square spot or a linear beam of several millimeters in width and tens of centimeters in length and scanning is made with the processed laser beam (i.e., a laser beam illumination position is moved relative to an illumination surface) is favorably used because it provides high mass-productivity and is superior from the industrial point of view.

In particular, in contrast to the case of using a spot-like laser beam that requires scanning in two orthogonal directions, the use of a linear laser beam can provide high mass-productivity because the entire illumination subject surface can be illuminated with laser light by scanning it with the linear laser beam only in the direction perpendicular to its length direction. The scanning is made in the direction perpendicular to the length direction because the scanning in such a direction is most efficient. Because of the high mass-productivity, the use of a linear laser beam is now becoming the mainstream in the laser annealing.

There are several problems in the case of performing laser annealing on a non-single crystal semiconductor film by scanning it with a pulse laser beam that has been processed into a linear shape. Among those problems, one of the particularly serious problems is that laser annealing is not performed uniformly over the entire film surface. When linear laser beams started to be used, there occurred a marked phenomenon that stripes were formed at beam overlapping portions. A film showed much different electrical characteristics from one stripe to another.

FIG. 1A shows how such stripes are formed. Stripes appear depending on the manner of light reflection when the surface of a laser-annealed silicon film is observed.

FIG. 1A is of a case where a linear laser beam extending in the right-left direction in the paper surface that is emitted from a XeCl excimer laser is applied while scanning is made in the top-to-bottom direction in the paper surface. It is understood that the stripes of FIG. 1A originate from the manner of overlapping of shots of pulse laser beams.

Where an active matrix liquid crystal display was manufactured by using a silicon film that exhibits stripes as shown in FIG. 1A, there occurred a problem that similar stripes appeared on the screen. This problem is now being solved by improving a non-single crystal semiconductor film as a subject of laser beam illumination and making the linear laser beam scanning pitch (interval between adjacent linear laser beams) finer.

As the above type of stripes become less conspicuous, non-uniformity in the energy profile of a beam itself comes to appear.

In general, in forming a linear laser beam, an original rectangular beam is processed into a linear shape by inputting it to a proper optical system. A rectangular beam having an aspect ratio of 2 to 5 is modified into a linear beam having an aspect ratio of 100 or more by an optical system of FIG. 2, for instance. This optical system is so designed that the intrabeam energy profile is uniformized at the same time.

The apparatus of FIG. 2 has a function of converting a laser beam emitted from an oscillator 201 (approximately rectangular at this stage) into a linear beam with an optical system denoted by reference numerals 202–204, 206, and 208 and applying the linear beam. Reference numerals 205 and 207 denote a slit and a mirror, respectively.

A cylindrical lens group (also called a multiple cylindrical lens) 202 has a function of dividing a beam into many beams. The many divided beams are combined by a cylindricaL lens 206.

The above components are needed to improve the intrabeam intensity profile. A combination of a cylindrical lens group 203 and a cylindrical lens 204 has the same function as the combination of the cylindrical lens group 202 and the cylindrical lens 206.

That is, the combination of the cylindrical lens group 202 and the cylindrical lens 206 has a function of improving the intensity profile of a linear laser beam in the longitudinal direction and the combination of the cylindrical lens group 203 and the cylindrical lens 204 has a function of improving the intensity profile of a linear laser beam in the width direction.

An optical system having a role of uniformizing the intrabeam energy profile is called a beam homogenizer. The optical system of FIG. 2 is also a beam homogenizer. One method of uniformizing the energy profile is to divide an original rectangular beam, enlarging the divided beams, and then combining the enlarged beams.

It appears that a beam that has been reconstructed after dividing an original beam in the above manner would have a higher degree of uniformity in energy profile as the beam division is made finer. However, when a beam obtained in the above manner was actually applied to a semiconductor film, stripes as shown in FIG. 1B occurred in the film in spite of fine beam division.

Like the case of FIG. 1A, FIG. 1B is of a case where a linear laser beam extending in the right-left direction in the paper surface that was emitted from a XeCl excimer laser was applied to a silicon film while scanning was made in the top-to-bottom direction in the paper surface. However, in the case of FIG. 1B, the scanning conditions were set properly so that no marked stripes as shown in FIG. 1A appear.

As shown in FIG. 1B, innumerable stripes are formed perpendicularly to the longitudinal direction of a linear laser beam. Stripes of this type should be formed due to a striped energy profile of an original rectangular beam or the optical system.

To investigate whether stripes were caused by a striped energy profile of an original rectangular beam or the optical system, the inventors conducted a simple experiment. In the experiment, it was studied how stripes varied as a rectangular laser beam was rotated before entering the optical system.

No variation was observed at all. Therefore, it was confirmed that the optical system caused stripes rather than an original rectangular beam. It is concluded that stripes are an interference fringe of light because the optical system uniformizes the energy profile of a single-wavelength, phase-equalized beam (a laser beam is phase-equalized because a laser produces high-intensity light by equalizing the phase) by dividing it and combining the divided beams.

FIG. 3 illustrates a light interference fringe 302 in a linear laser beam 301 that is formed by the optical system of FIG. 2. In FIG. 3, symbol I represents the laser light intensity. The interference fringe 302 is produced in such a manner that when beams obtained by dividing an original beam by the cylindrical lens groups 202 and 203 of the optical system of FIG. 2 are combined by the cylindrical lenses 204 and 206, the divided beams interfere with each other and a stationary wave is thereby formed in the beam.

That is, the reason why sharp, periodic interference peaks are generated is that divided beams are superimposed one on another in the same region on an illumination surface.

As shown in FIG. 3, the amplitude of waves varies periodically. In the case of the optical system of FIG. 2, three waves are formed per one period in the longitudinal direction of a linear beam.

The number n of waves (i.e., the number of interference peaks) per pitch and the number s of lenses of the cylindrical lens group 202 satisfy the following relationship:

n=(s−1)/2 (s: odd number)

n=s/2 (s: even number)

In the optical system of FIG. 2, the number n is equal to 3 because the number s of lenses of the cylindrical lens group 202 is 7 (odd number).

In this case, an interference state shown in FIG. 4A is obtained. FIG. 4A, which was obtained by a computer calculation, shows an interference state in a linear laser beam at a certain time point. The horizontal axis of FIG. 4A corresponds to the position in the longitudinal direction of a linear laser beam, and the square of a value on the vertical axis of FIG. 4A corresponds to the light intensity in an actual interference state. For example, the interference state of FIG. 4A is actually observed as the light intensity profile shown in FIG. 3.

Where the number s of lenses of the cylindrical lens group 202 is equal to 8, an interference pattern as shown in FIG. 4B is obtained.

In FIGS. 4A and 4B, the square of the amplitude represents the strength of interference (i.e., the degree of an action that beams having the same phase intensify each other) and parameter d is defined as the pitch of interference peaks.

The curves of FIGS. 4A and 4B were obtained by a computer simulation and actual interference fringes of laser beams do not exhibit so clear strong and weak portions. This is considered due to dispersion, refraction, and loss of light that are caused by slight deviations in the optical system, the materials of the components of the optical system, and processing errors of the optical system, energy dispersion in a semiconductor film that is caused by heat conduction, and other factors.

SUMMARY OF THE INVENTION

An object of the present invention is to lower the degree of illumination unevenness of a linear laser beam.

Each aspect of the invention will be described below. In the following description, N is a natural number, n is an integer that is greater than or equal to 3, and n' is an integer that satisfies $3 \leq n' \leq n$.

According to a first aspect of the invention, there is provided a beam homogenizer having a function of forming a sinusoidal stationary wave on an illumination surface by dividing a laser beam and recombining divided laser beams.

According to a second aspect of the invention, there is provided a beam homogenizer comprising a first optical lens for dividing a light beam into N(n'−1) beams in a vertical direction; a second optical lens for dividing the light beam into (2n+1) beams in a horizontal direction; a third optical lens for recombining the beams that are divided in the vertical and horizontal directions into (n'−1) beams while superimposing the (n'−1) beams so that they are deviated from each other in the horizontal direction; and a fourth optical lens for recombining the beams that are divided in the vertical direction.

According to a third aspect of the invention, there is provided a beam homogenizer comprising a first optical lens for dividing a light beam into N(n−1) beams in a vertical direction; a second optical lens for dividing the light beam into (2n+1) beams in a horizontal direction; a third optical lens for recombining the beams that are divided in the vertical and horizontal directions into (n−1) beams while superimposing the (n−1) beams so that they are deviated from each other in the horizontal direction; and a fourth optical lens for recombining the beams that are divided in the vertical direction.

According to a fourth aspect of the invention, there is provided a beam homogenizer comprising a first optical lens for dividing a light beam into N(n'−1) beams in a vertical direction; a second optical lens for dividing the light beam into (2n) beams in a horizontal direction; a third optical lens for recombining the beams that are divided in the vertical and horizontal directions into (n−1) beams while superimposing the (n−1) beams so that they are deviated from each other in the horizontal direction; and a fourth optical lens for recombining the beams that are divided in the vertical direction.

According to a fifth aspect of the invention, there is provided a beam homogenizer comprising a first optical lens for dividing a light beam into N(n−1) beams in a vertical direction; a second optical lens for dividing the light beam into (2n) beams in a horizontal direction; a third optical lens for recombining the beams that are divided in the vertical and horizontal directions into (n−1) beams while superimposing the (n−1) beams so that they are deviated from each other in the horizontal direction; and a fourth optical lens for recombining the beams that are divided in the vertical direction.

According to a sixth aspect of the invention, there is provided a laser illumination apparatus comprising means for generating a laser beam; a beam homogenizer comprising an optical lens for dividing the laser beam into N(n'−1) beams in a vertical direction; a cylindrical lens group for dividing the laser beam into (2n+1) beams in a horizontal direction; (n'−1) cylindrical lenses for recombining the beams that are divided in the horizontal direction while superimposing the divided beams so that they are deviated from each other by d/(n'−1) in the horizontal direction; and a cylindrical lens for recombining the beams that are divided in the vertical direction; and a moving table that is movable in one direction, wherein d is defined as an interval of peaks of an interference fringe that is formed on an illumination surface by a beam that has passed through one of the (n'−1) cylindrical lenses.

According to a seventh aspect of the invention, there is provided a laser illumination apparatus comprising means for generating a laser beam; a beam homogenizer comprising an optical lens for dividing the laser beam into N(n−1) beams in a vertical direction; a cylindrical lens group for dividing the laser beam into (2n+1) beams in a horizontal direction; (n−1) cylindrical lenses for recombining the beams that are divided in the horizontal direction while superimposing the divided beams so that they are deviated from each other by d/(n−1) in the horizontal direction; and a cylindrical lens for recombining the beams that are divided in the vertical direction; and a moving table that is movable in one direction, wherein d is defined as an interval of peaks of an interference fringe that is formed on an illumination surface by a beam that has passed through one of the (n−1) cylindrical lenses.

According to an eighth aspect of the invention, there is provided a laser illumination apparatus comprising means for generating a laser beam; a beam homogenizer comprising an optical lens for dividing the laser beam into N(n'−1) beams in a vertical direction; a cylindrical lens group for dividing the laser beam into (2n) beams in a horizontal direction; (n'−1) cylindrical lenses for recombining the beams that are divided in the horizontal direction while superimposing the divided beams so that they are deviated from each other by d/(n'−1) in the horizontal direction; and a cylindrical lens for recombining the beams that are divided in the vertical direction; and a moving table that is movable in one direction, wherein d is defined as an interval of peaks of an interference fringe that is formed on an illumination surface by a beam that has passed through one of the (n'−1) cylindrical lenses.

According to a ninth aspect of the invention, there is provided a laser illumination apparatus comprising means for generating a laser beam; a beam homogenizer comprising an optical lens for dividing the laser beam into N(n−1) beams in a vertical direction; a cylindrical lens group for dividing the laser beam into (2n) beams in a horizontal direction; (n−1) cylindrical lenses for recombining the beams that are divided in the horizontal direction while superimposing the divided beams so that they are deviated from each other by d/(n−1) in the horizontal direction; and a cylindrical lens for recombining the beams that are divided in the vertical direction; and a moving table that is movable in one direction, wherein d is defined as an interval of peaks of an interference fringe that is formed on an illumination surface by a beam that has passed through one of the (n−1) cylindrical lenses.

In the sixth to ninth aspects of the invention, d may be approximately expressed by $d=\lambda f/L$, where $\lambda$ is the wavelength of the laser beam, f is the focal length of the (n'−1) or (n−1) cylindrical lenses, and L is the width of each constituent lens of the cylindrical lens group.

The invention is particularly effective if on the illumination surface the laser beam is a linear beam having a longer axis in the horizontal direction.

In general, the laser beam is an excimer laser beam.

It is preferable that the moving direction of the moving table be variable.

To avoid misunderstanding, it is noted that in the specification the horizontal and vertical directions mean the longitudinal direction and the width direction, respectively, of a linear laser beam.

According to a 10th aspect of the invention, there is provided a semiconductor device manufactured by using a semiconductor film that has been formed by laser annealing that uses a laser beam produced by the beam homogenizer according to the first aspect of the invention.

According to an 11th aspect of the invention, there is provided a semiconductor device manufactured by using a semiconductor film that has been formed by laser annealing that uses a laser beam produced by the beam homogenizer according to the second aspect of the invention.

According to a 12th aspect of the invention, there is provided a semiconductor device manufactured by using a semiconductor film that has been formed by laser annealing that uses a laser beam produced by the beam homogenizer according to the fourth aspect of the invention.

In crystallizing or improving the crystallinity of a non-single-crystal semiconductor film by using a laser beam that has been processed into a linear shape by dividing an original laser beam and recombining the divided beams, the invention prevents a processed semiconductor film from reflecting light-interference-induced periodic energy unevenness in the linear laser beam.

For example, the energy profile of a linear laser beam that is formed by the optical system of FIG. 2 has a periodic intensity pattern in the longitudinal direction as shown in FIGS. 4A and 4B. If a linear laser beam having such an energy profile is applied to a semiconductor film, a processed semiconductor film exactly reflects the energy profile.

By using a new beam homogenizer, the invention makes the interference profile in a linear laser beam much more distributed (see FIGS. 7A–7G) than obtained by conventional beam homogenizers, and thereby uniformizes the energy profile in the linear laser beam. This enables laser annealing to produce a result having a higher degree of uniformity.

BRIEF DESCRIPTION OF THE DRAWINGS

FIG. 2 shows a conventional optical system for forming a linear laser beam and an optical path thereof;

FIGS. 5 and 6 show an optical system for forming a linear laser beam according to a first embodiment of the invention and an optical path thereof;

DETAILED DESCRIPTION OF THE INVENTION

In the optical system of FIG. 2, if the cylindrical lens 206 is divided along a broken line 210 and the divided parts are deviated from each other by a proper distance in the direction perpendicular to the paper surface, beams that pass through the upper half of the cylindrical lens 206 and beams that pass through the lower half are superimposed on each other on the illumination surface so as to be deviated from each other properly, whereby a different beam interference pattern is formed. By utilizing this phenomenon in a proper manner, that is, by properly setting the offset of the top and bottom divisional lenses of the cylindrical lens 206, interference peaks in a beam can be distributed evenly. This is apparent from the principle of superposition of waves.

Figure 6:
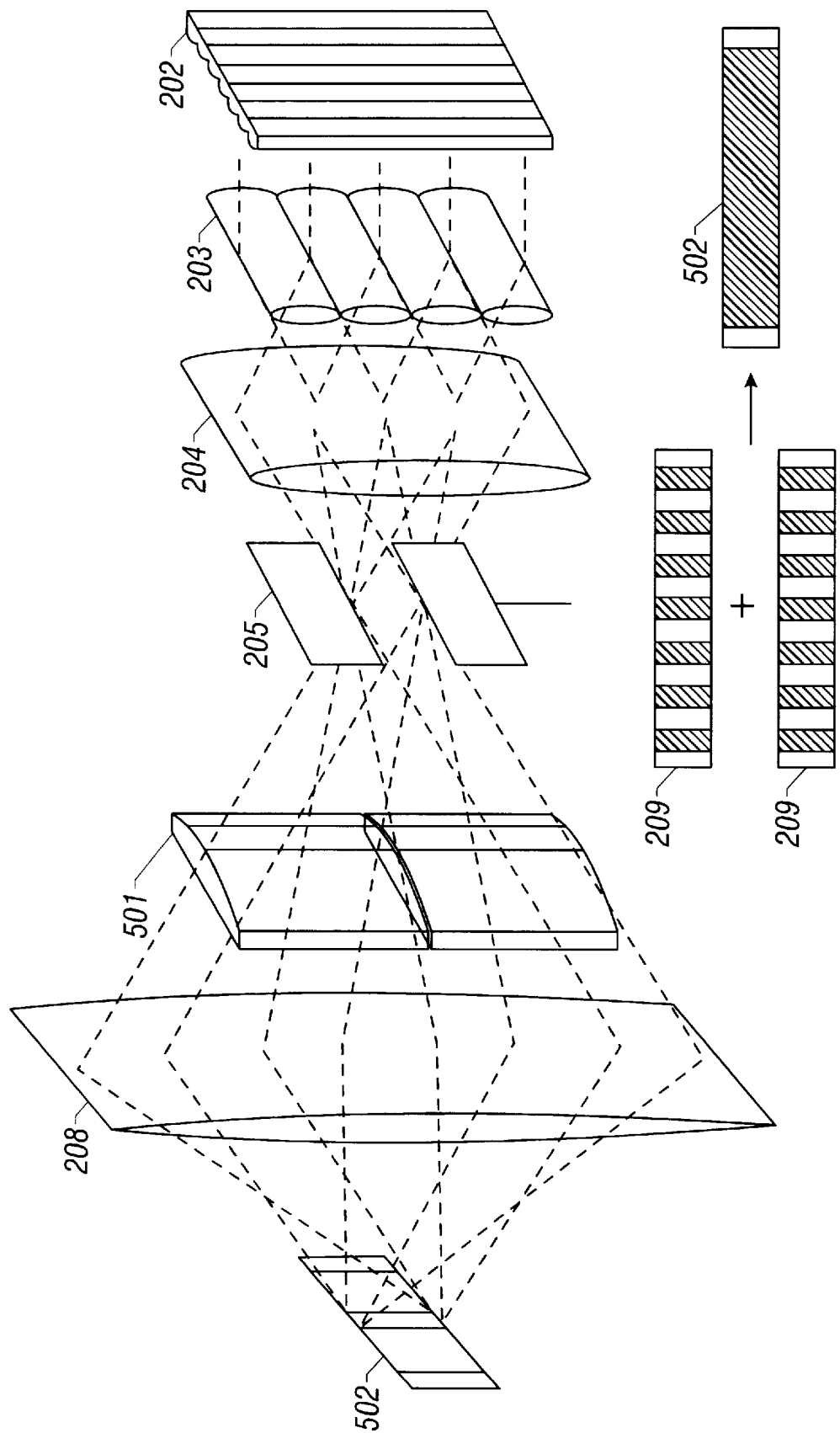

FIGS. 5 and 6 show such an optical system. A cylindrical lens 501 in FIG. 5 corresponds to the top/bottom-divided version of the cylindrical lens 206 in FIG. 2. FIG. 6 is a perspective view of the optical system of FIG. 5. The mirror 207 that is shown in FIG. 5 is omitted in FIG. 6.

The invention is intended to determine features of an optical system that can distribute interference peaks most efficiently.

Figure 7A:
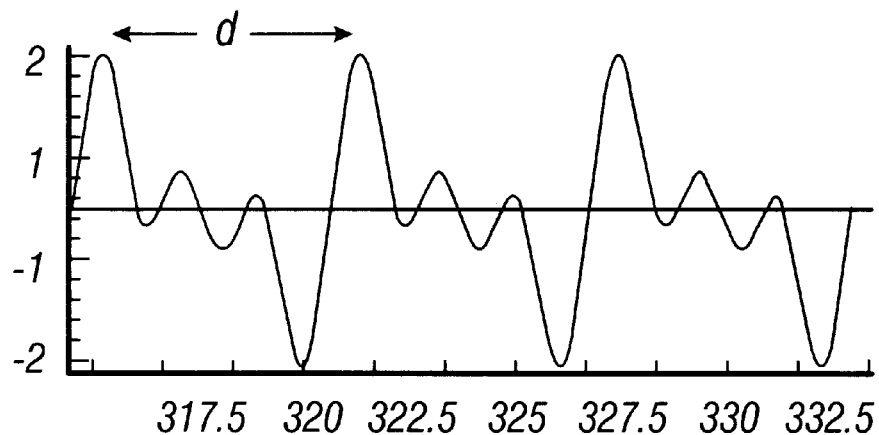
FIGS. 7A–7G show methods of superimposing interference fringes for making light interference less conspicuous.

FIG. 7A shows an interference fringe pattern that is produced by the apparatus of FIG. 2 when the number of lenses of the cylindrical lens group 202 is seven. The square of a value of the interference fringe pattern corresponds to the light intensity. The right-left direction of FIG. 7A corresponds to the longitudinal direction of a linear laser beam. Parameter d is defined as the length of the one period of the interference fringe pattern of FIG. 7A. The one period is in accordance with the pitch of the interference fringe.

The inventors performed computer calculations to search for a pattern that was obtained by adding patterns like the pattern of FIG. 7A and in which interference peaks were distributed most evenly. The best pattern was obtained when two patterns of FIG. 7A were shifted from each other by a half pitch and then superimposed on each other.

Figure 7B:
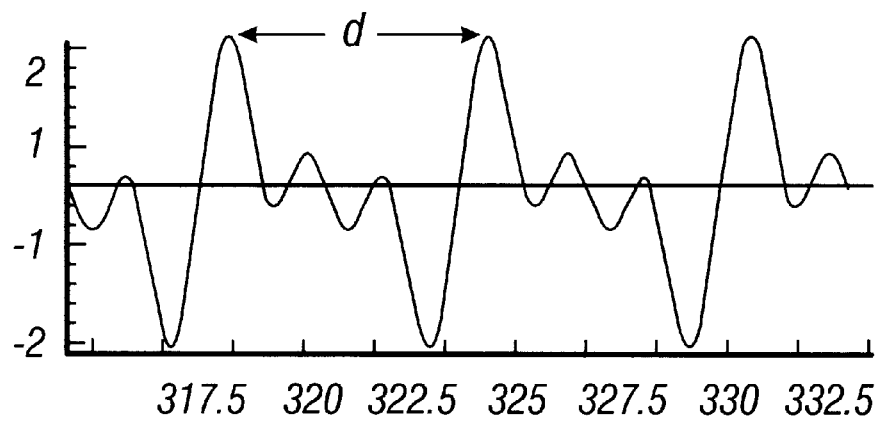
Figure 7C:
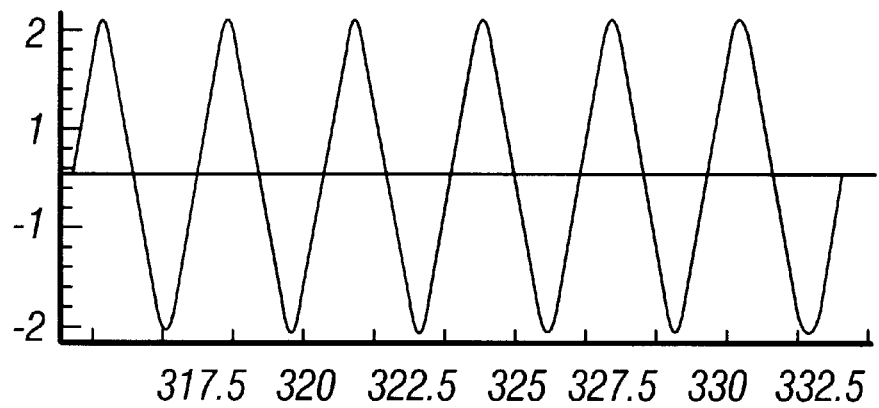

Specifically, when the pattern of FIG. 7A was superimposed on a pattern of FIG. 7B that was obtained by shifting the pattern of FIG. 7A by half period, a pattern of FIG. 7C was obtained.

In the pattern of FIG. 7C, the degree of interference is more distributed than in the patterns of FIGS. 7A and 7B.

Figure 7D:
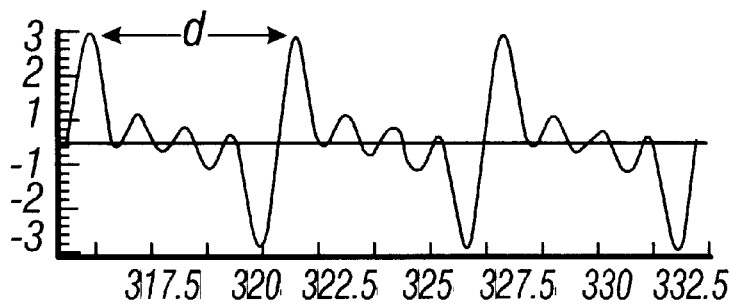

FIG. 7D shows an interference fringe pattern that is produced by the apparatus of FIG. 2 when the number of lenses of the cylindrical lens group 202 is nine. Parameter d is defined as the one period of the interference fringe pattern of FIG. 7D.

The inventors performed computer calculations to search for a pattern that was obtained by adding patterns like the pattern of FIG. 7D and in which interference peaks were distributed most evenly. The best pattern was obtained when three patterns of FIG. 7D were shifted from each other by $\frac{1}{3}$ period and then superimposed one on another (see FIG. 7G).

Figure 7E:
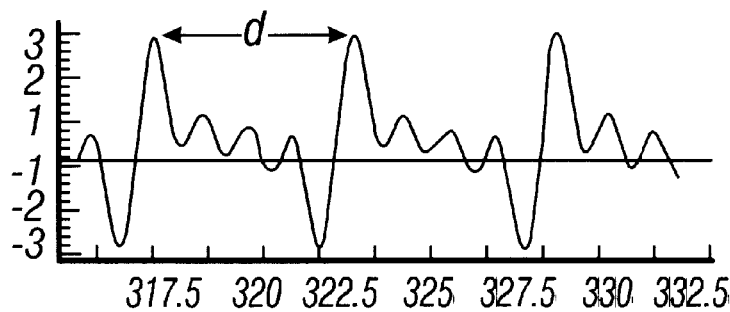
Figure 7F:
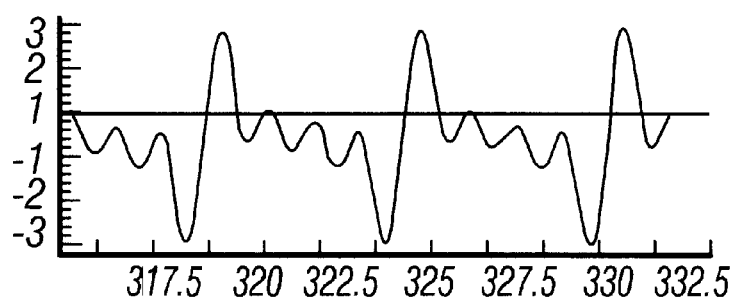

Specifically, interference patterns of FIGS. 7E and 7F were produced by shifting the interference pattern of FIG. 7D by a $\frac{1}{3}$ pitch and a $\frac{2}{3}$ pitch, respectively. When the interference patterns of FIGS. 7D–7F were superimposed one on another, an interference pattern of FIG. 7G was obtained.

Figure 7G:
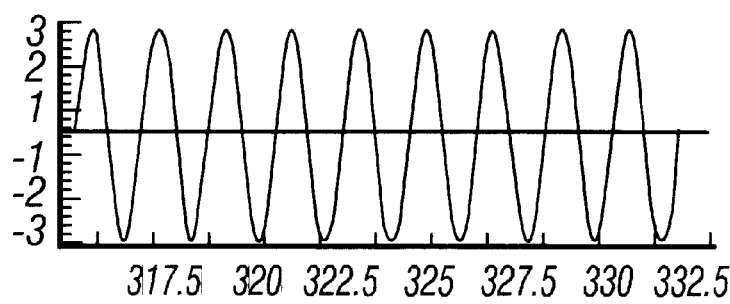

In the interference pattern of FIG. 7G, the degree of interference is much more distributed than in the interference patterns of FIGS. 7D–7F.

To realize the above superposition, it is necessary to produce laser beams having interference states of FIGS. 7A and 7B, for instance.

A laser beam produced by the combination of the cylindrical lens group 202 and the cylindrical lens 206 is also divided into a plurality of beams by the cylindrical lens group 203. Therefore, by causing the divided laser beams that are produced by the cylindrical lens group 203 to be superimposed one on another so as to be deviated from one another with subtle positional relationships, a laser beam having interference peaks that are more distributed than in FIGS. 7C and 7G can be obtained.

The cylindrical lens 501 plays a role of shifting laser beams. For example, where the number of lenses of the cylindrical lens group 202 is seven, a laser beam as shown in FIG. 7C can be obtained by using the cylindrical lens 501 that is divided into two parts, that is, top and bottom parts. In this case, it is preferable that the cylindrical lens group 203 divide a laser beam into an even number of beams. If this is the case, resulting laser beams are properly distributed to the top and bottom lenses as shown in the bottom part of FIG. 5 and hence no distortion occurs in the optical paths of the laser beams. In the case of FIG. 5, since the cylindrical lens 203 produces four beams, two beams enter each of the top and bottom lenses of the cylindrical lens 501.

Where the number of lenses of the cylindrical lens group 202 is nine, a laser beam as shown in FIG. 7G can be obtained by using the cylindrical lens 501 that is divided into three parts, that is, top, middle, and bottom parts. In this case, it is preferable that the cylindrical lens group 203 divide a laser beam into a multiple-of-3 beams. If this is the case, resulting laser beams are properly distributed to the top, middle and bottom lenses and hence no distortion occurs in the optical paths of the laser beams.

However, the cylindrical lens 501 is divided into three or more parts, the alignment of the optical system becomes unduly complex. Therefore, the cylindrical lens 501 may be divided into two parts rather than three parts. Interference peaks were properly distributed even by superimposing two laser beams as shown in FIG. 7D that are shifted from each other by a half pitch. In this case, the cylindrical lens 501 is of a type that is divided into two parts, that is, top and bottom parts. The cylindrical lens group 2C3 may divide a laser beam into a multiple-of-2 beams.

The invention provides an optimum combination of parameters for the above-described scheme. That is, the invention is intended to determine features of an optical system that can distribute interference peaks most efficiently.

In the following description, N is assumed to be a natural number while the number n of the interference peaks per one period in the longitudinal direction of a linear laser beam is an integer that is greater than or equal to 3. In the optical system of FIG. 5, N=2 and n=3. This is because when n=3, the numbers of lenses of the cylindrica lens group 202 is seven and the number N(n−1) of lenses of the cylindrical lens group 203 is four.

In FIGS. 4A–4B and 7A–7G, parameter d indicates the interval (the length of one period) of an interference pattern that is formed on the illumination surface by a beam that has passed through one of the lenses that constitute the cylindrical lens 501. The value of d can be obtained by observing a laser beam that is produced when the cylindrical lens 501 is covered except one constituent lens, or observing annealing effect or the like of that laser beam. The value of d can also be calculated as described later in the third embodiment.

A description will now be made of a proper deviation between the constituent lenses of the cylindrical lens 501 to obtain the effect of the invention.

Where the number of lenses of the cylindrical lens group 202 is seven, n is equal to 3 and hence the number of lenses of the cylindrical lens group 203 may be a multiple of (n−1), that is, an even number. In this case, the top and bottom lenses of the cylindrical lens 501 may be deviated from each other by a distance d/2.

Where the number of lenses of the cylindrical lens group 202 is nine, n is equal to 4 and hence a beam that is sufficiently uniform can be obtained if the number of lenses of the cylindrical lens group 203 is a multiple of 3 (i.e., (n−1)), for instance, 6. A beam that is higher in the degree of uniformity can be obtained when the cylindrical lens 501 is divided into three parts than two parts. In the former case, the top, middle, and bottom lenses of the cylindrical lens 501 may be deviated from each other by a distance d/3.

However, because of the structure of the optical system, the alignment of the optical system becomes more difficult when the cylindrical lens 501 is divided into three or more parts. For example, the cylindrical lens 501 may be divided into two parts even in a case where a beam that is higher in the degree of uniformity can be obtained by designing the optical system using the 3-piece-divided cylindrical lens 501.

From the above discussions and calculations, it is understood that where the number of lenses of the cylindrical lens group 202 is an odd number, the cylindrical lens 501 may be divided into (n−1) parts and the (n'−1) lenses mav be deviated from each other by d/(n'−1), where n' is an integer in a range of 3≦n'≦n. In this case, satisfactory results were obtained when the cylindrical lens group 203 had N(n'−1) constituent lenses.

With the above design, divided laser beams produced by the cylindrical lens group 203 can be superimposed one on another in a manner as shown in FIGS. 7A–7G and a laser beam having a uniformized interference state as shown in FIG. 7C or 7G can be obtained.

The configuration of the optical system shown in FIGS. 5 and 6 is the basic one and other optical systems may be used. Part of the lenses may be replaced by lenses having similar functions. Further, the optical system of FIGS. 5 and 6 may be used as part of the entire optical system. For example, although the cylindrical lens group 202 and the cylindrical lens group 203 are convex lens groups, they may be concave lens groups or concave/convex-mixed lens groups.

A laser beam may be divided by a method other than the method using cylindrical lenses. For example, the cylindrical lens group 203 and the cylindrical lens 204 may be replaced by multi-phase lenses having almost the same functions (see FIG. 11B).

The above configuration is particularly effective in converting a laser beam whose aspect ratio is not very large into a linear laser beam having an aspect ratio of 100 or more.

In contrast to the case where the number of lenses of the cylindrical lens group 202 is an odd number, remarkable effect is not obtained when it is an even number. (It goes without saying that the cylindrical lens group 202 can be regarded as being constituted of an odd number of lenses when laser beams corresponding to an odd-numbered part of the cylindrical lens group 202 are substantially used by the downstream lenses even if the cylindrical lens group 202 is constituted of an even number of lenses.)

Where the number of lenses of the cylindrical lens group 202 is an odd number, it is possible to produce a beam having a sinusoidal interference profile as shown in FIGS. 7C and 7G in which interference peaks are more distributed in the beam. Where the number of lenses of the cylindrical lens group 202 is 2 or 3, a beam having a sinusoidal interference profile can be obtained by the optical system of FIG. 2. However, since the number of divided beams is insufficient, it is difficult to obtain a uniform beam. The invention is epoch-making because it enables use of a sufficient number of divided beams and provides a beam having a sinusoidal interference profile.

Where the number of lenses of the cylindrical lens group 202 is an even number, a beam having so clearly distributed interference peaks cannot be obtained. However, even in this case, marked improvement is obtained as compared to the conventional optical system (see FIG. 2). That is, the effect of distributing the interference and thereby correcting illumination unevenness can be obtained.

Also where the number of lenses of the cylindrical lens group 202 is an even number, the cylindrical lens 501 may be divided into (n'−1) parts and the (n−1) lenses may be deviated from each other by d/(n'−1). With this design, interference peaks were distributed properly. In this case, parameter d is defined as shown in FIG. 4B. Satisfactory results were obtained when the cylindrical lens group 203 was constituted of N(n'−1) lenses.

Figure 1A:
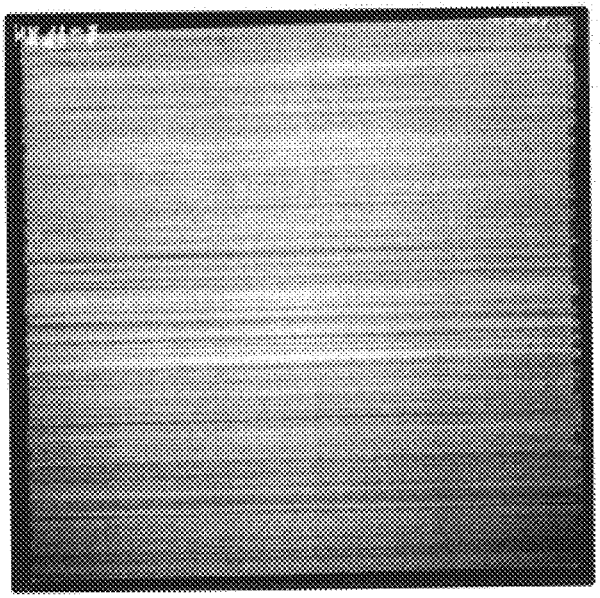
FIGS. 1A and 1B are photographs of silicon films that were crystallized by laser annealing that used a linear laser beam.
Figure 1B:
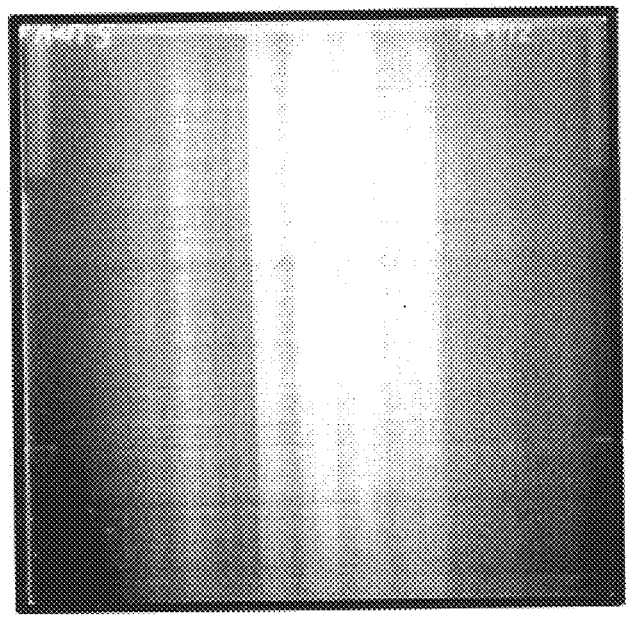
Figure 3:
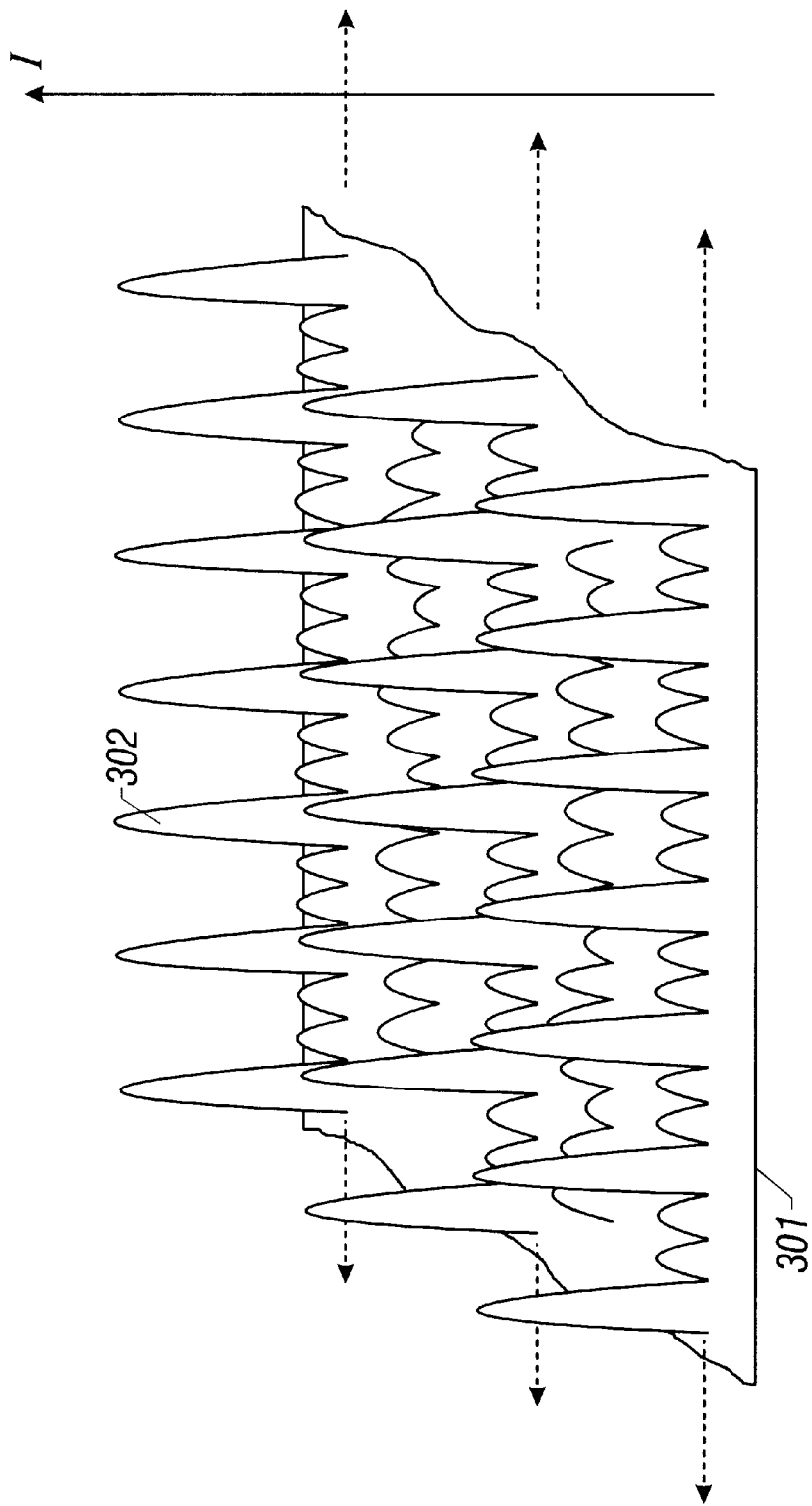
FIGS. 3 and 4A–4B illustrate light interference in a linear laser beam that is formed by the conventional optical system.
Figure 4A:
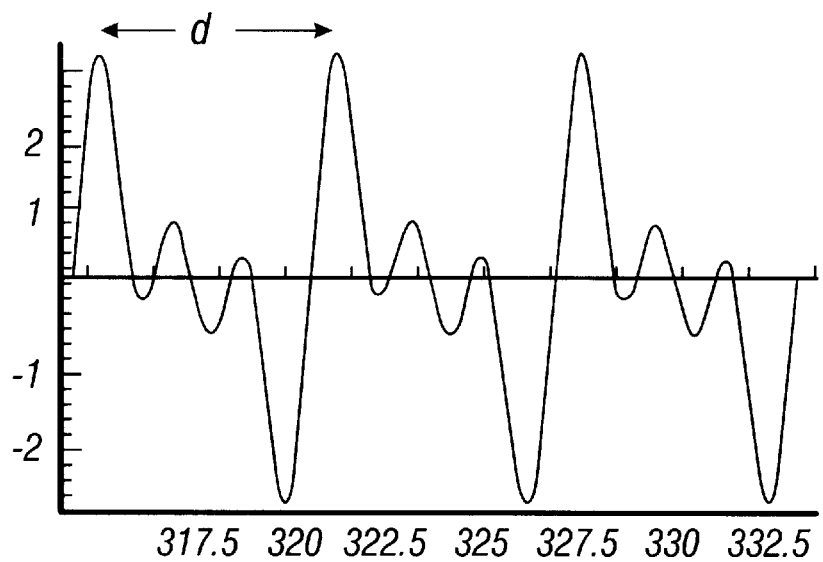
Figure 4B:
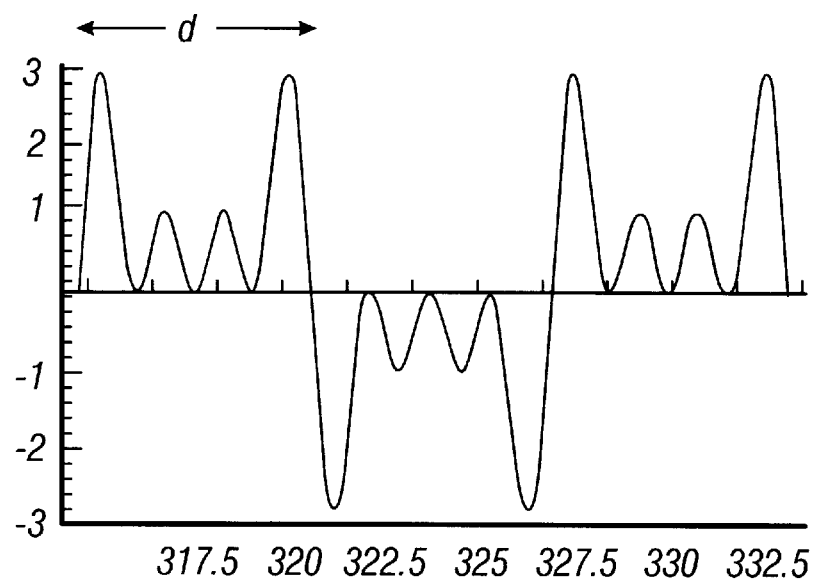

Incidentally, parameter d is defined as the pitch (the length of one period) of interference peaks as shown in FIGS. 4A or 4B, that is, the pitch of an interference state appearing in a beam (linear laser beam) that corresponds to one constituent cylindrical lens of the cylindrical lens 501.

As is understood from the above description, it is preferable that the intervals d of an interference fringe be constant in a laser beam. That is, it is preferable that interference peaks appear at a fixed period in the longitudinal direction of a linear beam as shown in FIGS. 4A and 4B.

However, except for certain special cases, the intervals between interference peaks in a linear laser beam produced by the optical system of FIG. 2 are not constant.

This is because a linear beam is obtained by combining spherical waves. (See FIG. 8A. When a spherical wave is cut by a straight line, intervals between points having the same phase are not constant.)

When it is necessary to make the intervals of interference peaks approximately constant, one method is to combine plane waves into a linear shape. (When a plane wave is cut obliquely by a straight line, intervals between points having the same phase become constant.)

Figure 8A:
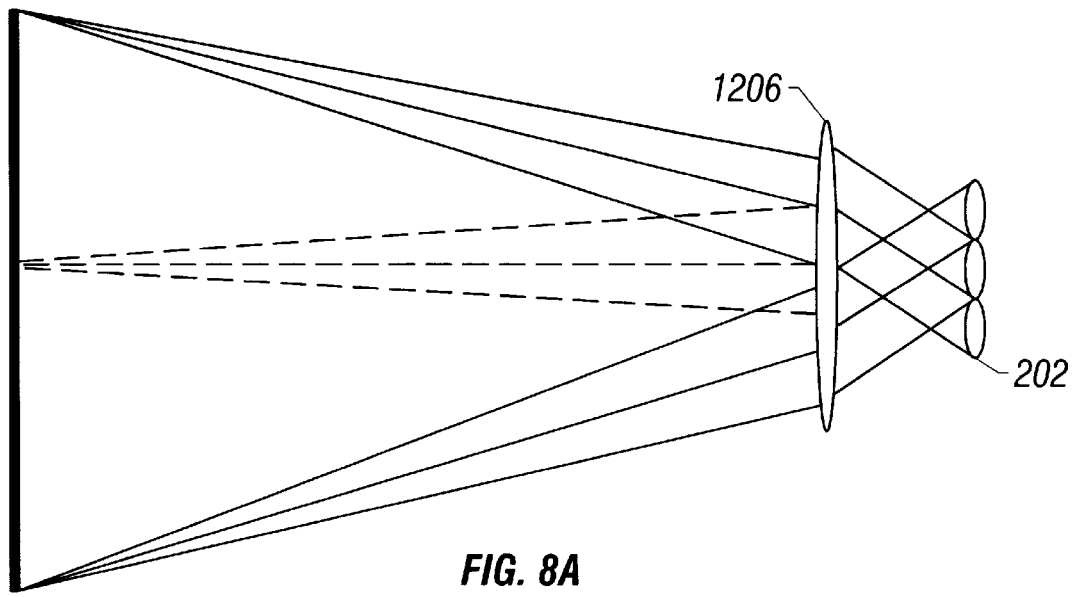
FIGS. 8A and 8B illustrate a difference in arrangement between an optical system that produces spherical waves and an optical system that produces a plane waves.
Figure 8B:
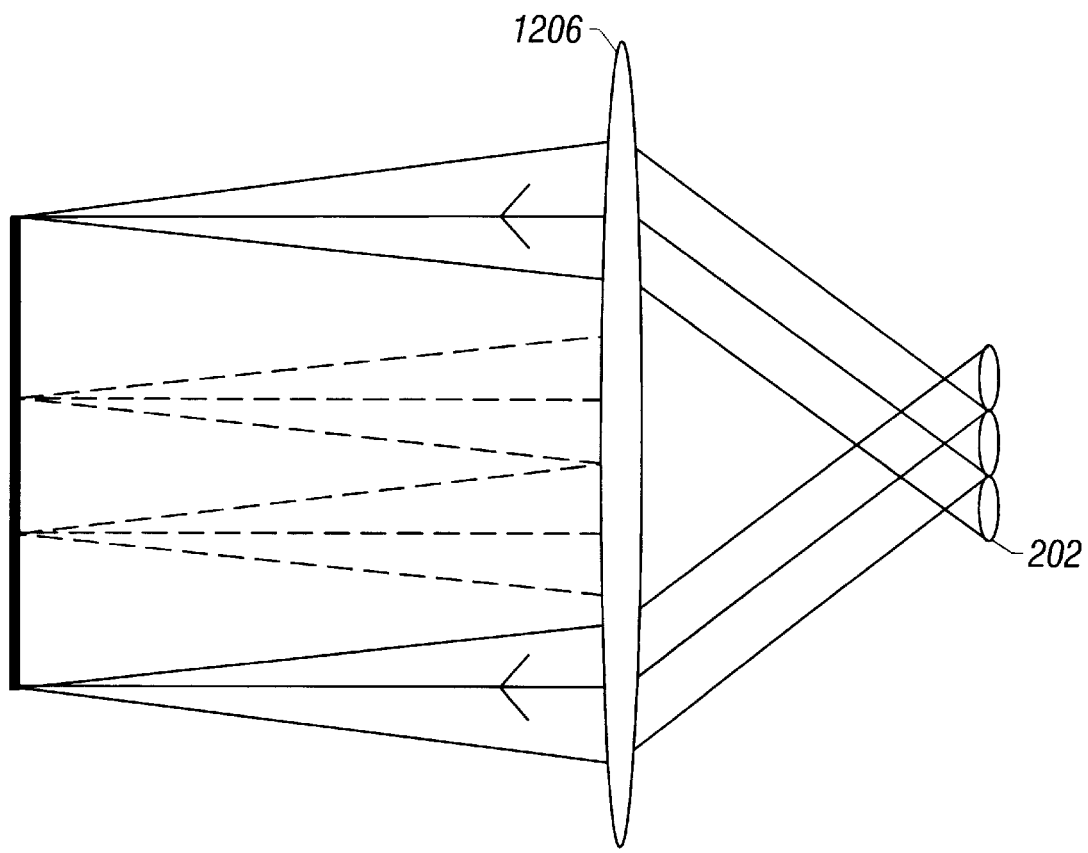

FIG. 8B shows an optical system for forming such light waves. This optical system is different from the optical system of FIG. 8A in that all the divided laser beams produced by the incident-side cylindrical lens are converted into parallel beams by the downstream cylindrical lens.

This type of optical system can easily be obtained by properly setting the distance between the front and rear cylindrical lenses. With this design, any of the divided beams produced by the cylindrical lens group can be converted into a plane wave by the cylindrical lens. When a beam produced by this optical system is used, the intervals between vertical stripes becomes approximately constant. The optical system having this arrangement is most suitable for the invention.

However, even a linear beam obtained by combining spherical waves can substantially be regarded as being constituted of parallel beams because the radius of curvature of the spherical waves is sufficiently large. Therefore, the invention can also be utilized for such a case. Ln this case, the interval d of an interference fringe is defined as the average of all intervals.

As described above, the degree of uniformity of an interference fringe profile of a linear laser beam can greatly be increased by utilizing the invention. In particular, where the cylindrical lens group 202 is constituted of an odd number of lenses, a linear laser beam can be shaped so as to have a sinusoidal interference fringe profile (see FIGS. 7C and 7G), which means that the invention is utilized most effectively.

However, even if the invention is utilized, energy unevenness due to light interference still remains in a linear laser beam. Such unevenness may be emphasized depending on the laser beam illumination conditions.

The degree of unevenness that occurs in this manner can be reduced by finely adjusting the laser beam scanning direction. That is, laser processing may be performed while a linear laser beam is moved in a direction that exists in the plane of the linear laser beam and is deviated by an angle y from the direction that exists in the plane of the linear laser beam and is perpendicular to the longitudinal direction of the linear laser beam. The angle y can be found in a range of $0 < |\tan y| \leq 0.1$. ($|\tan y| \neq 0$)

If a polycrystalline semiconductor film is formed by laser-annealing a semiconductor film by using the optical system according to the invention and a device such as a TFT liquid crystal display device is manufactured by using the thus-formed polycrystalline semiconductor film, variations in the characteristics of the respective TFTs are reduced and there can be obtained a device capable of producing high-quality images.

If the invention is applied to laser annealing for manufacture of a semiconductor integrated circuit, the characteristics of elements formed on the same base member can be uniformized and there can be obtained a circuit exhibiting high performance.

Specific embodiments of the invention will be hereinafter described.

Embodiment 1

First, a method of forming a film to be subjected to laser illumination will be described as part of a manufacturing process of this embodiment. Three kinds of films to be subjected to laser illumination will be described in this specification. The invention can effectively be applied to any of those films.

First, for any of the three kinds of films, a 200-nm-thick silicon oxide film as an undercoat film and a 50-nm-thick amorphous silicon film are formed in this order on a 127-mm-square Corning 1737 glass substrate by plasma CVD. This film will be called a starting film in the following description.

(Procedure of Forming Film A)

The starting film is subjected to hot bathing of 450° C. and 1 hour. This step is to reduce the hydrogen is concentration of the amorphous silicon film. This step is necessary because the film cannot withstand laser energy if it contains an unduly large amount of hydrogen.

It is appropriate that the hydrogen concentration of the film be of the order of $10^{20}$ atoms/cm3. This film is called a silicon film A.

(Procedure of Forming Film B)

A nickel acetate layer is formed by applying a nickel acetate aqueous solution of 10 ppm to the starting film by spin coating. It is preferable that a surfactant be added to the nickel acetate aqueous solution. Being extremely thin, the nickel acetate layer does not necessarily assume a film form. However, this will not cause any problem in the ensuing steps.

The substrate on which the respective films have been laid in the above manner is subjected to thermal annealing of 600° C. and 4 hours. As a result, the amorphous silicon film is crystallized into a crystalline silicon film B.

In the above step, nickel as a catalyst element serves as nuclei for crystal growth and the crystallization is thereby accelerated. It is by virtue of the action of nickel that the crystallization can be performed at a low temperature of 600° C. in a short time of 4 hours. The details of this technique are disclosed in Japanese Unexamined Patent Publication No. 6-244104.

It is preferable that the concentration of the catalyst element be $1 \times 10^{15}$ to $1 \times 10^{19}$ atoms/cm$^3$. If the concentration is higher than $1 \times 10^{19}$ atoms/cm$^3$, the crystalline silicon film exhibits metal properties and loses semiconductor properties. In this embodiment, the concentration of the catalyst element in the crystalline silicon film is $1 \times 10^{17}$ to $5 \times 10^{18}$ atoms/cm$^3$ in terms of the minimum value in the film. These values were obtained through an analysis and a measurement by secondary ion mass spectroscopy (SIMS).

(Procedure of Forming Film C)

A 700-Å-thick silicon oxide film is formed on the starting film by plasma CVD.

Then, a complete opening is formed in a portion of the silicon oxide film by photolithographic patterning.

Then, to form a thin oxide film in the opening, UV light is applied for 5 minutes in an oxygen atmosphere. The thin oxide film is formed to improve the wettability of the opening with respect to a nickel acetate aqueous solution to be introduced later.

Then, a nickel acetate aqueous solution of 100 ppm is applied to the film by spin coating, whereby nickel acetate is introduced into the opening. It is preferable that a surfactant be added to the nickel acetate aqueous solution.

Then, thermal annealing is performed at 600° C. for 8 hours and a crystal grows laterally from the nickel-introduced portion. In this step, nickel plays the same role as in forming film B. With the conditions of the embodiment, a lateral growth length of about 40 μm was obtained.

In this manner, the amorphous silicon film is crystallized into a crystalline silicon film C which is a non-single-crystal silicon film. Subsequently, the silicon oxide film on the crystalline silicon film is peeled and removed by using buffered hydrofluoric acid.

In the above manners, the non-single-crystal silicon films A–C are obtained.

Then, to improve the crystallinity, laser annealing is performed by using an excimer laser.

Figure 9:
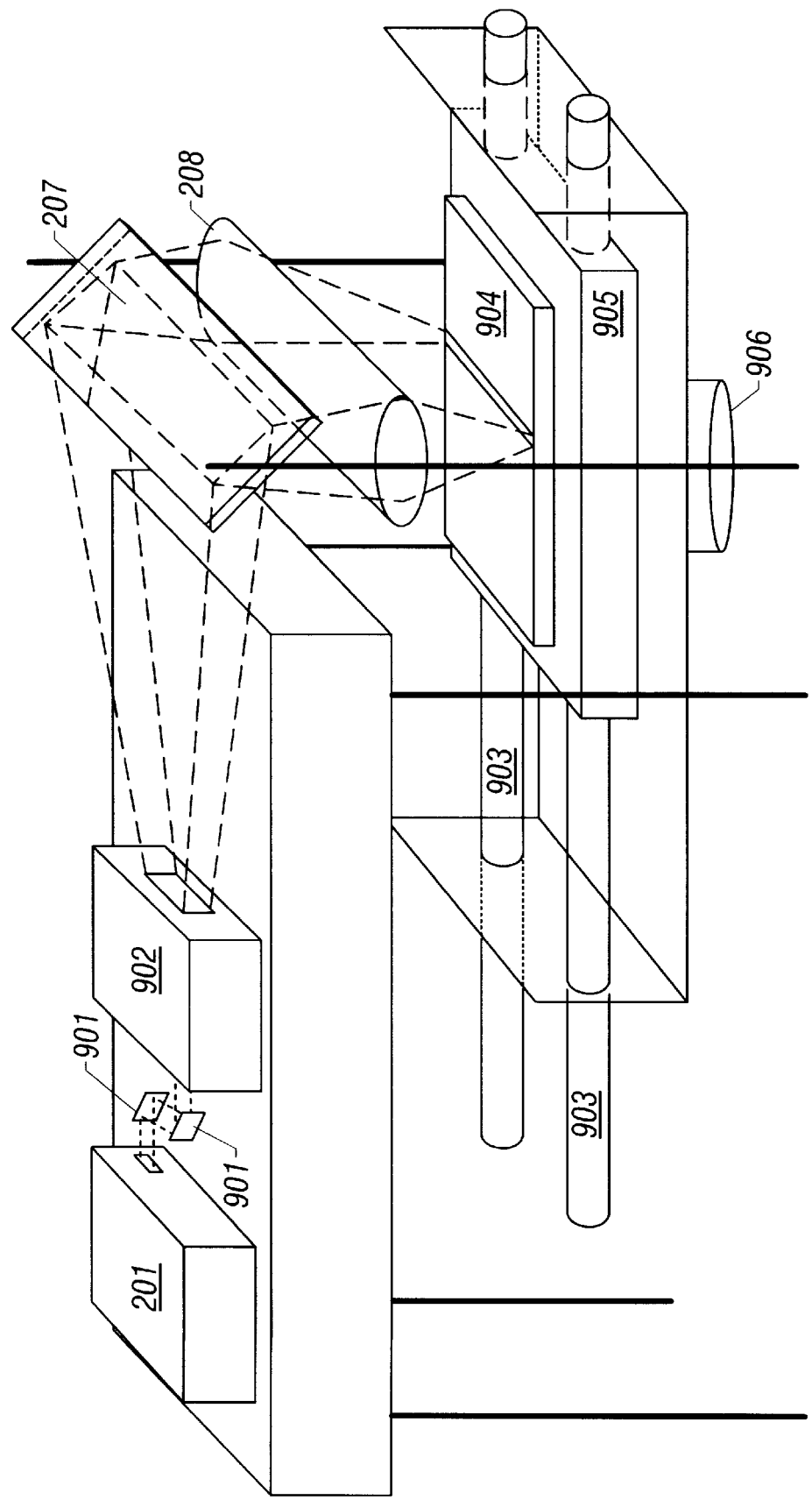
FIG. 9 shows a laser illumination system according to the first embodiment.

FIG. 9 schematically shows a laser illumination system according to the embodiment.

In the laser illumination system of FIG. 9, a pulse laser beam is emitted from a laser oscillation device 201 and its raveling direction is adjusted by a pair of reflection mirrors 901. Then, the sectional shape of the pulse laser beam is converted into a linear shape by an optical system 902 according to the invention. Then, the pulse laser beam is reflected by a mirror 207, focused by a cylindrical lens 208, and applied to a substrate 904 to be processed. A beam expander that can limit the divergence angle of a laser beam and adjust the beam size may be inserted between the pair of reflection mirrors 901.

The optical system 902, the mirror 207, and the cylindrical lens 208 are basically the same as those shown in FIG. 5.

In this embodiment, the above-described optical system according to the third aspect of the invention is employed as the optical system 902. In this embodiment, since the number of lenses of the cylindrical lens group 202 is seven (corresponds to (2n+1)), the cylindrical lens 501 is constituted of two (corresponds to (n−1)) lenses in the optical system of FIG. 5.

Now, a description will be made of a method of determining a distance by which the top and bottom lenses of the cylindrical lens 501 should be deviated from each other.

In this embodiment, the pitch of a light interference fringe in a linear laser beam that was formed by an arbitrarily selected one of the constituent lenses of the cylindrical lens 501 and the lenses of the optical system of FIG. 5 other than the cylindrical lens 501 was 0. 1 mm, which corresponds to parameter d of the invention.

As described above, a deviation distance that is calculated according to d/(n−1) can distribute interference peaks to a largest extent in a linear laser beam. is Substituting d=0.1 mm and n=3 into the above formula, we obtain a distance of 0.05 mm. It goes without saying that according to the principle of superposition of waves the same effect is obtained even if the distance is changed to 0.15 mm, 0.25 mm, 0.35 mm, . . . at intervals of 0.1 mm. As the distance is set longer, the effectively usable length in the longitudinal direction of a linear beam becomes shorter.

That is, where the top and bottom lenses of the cylindrical lens 501 are deviated from each other, both end portions of a linear laser beam in the longitudinal direction are blurred over the length that is equal to the deviation distance. However, both end portions in the width direction are not blurred at all. Since both end portions of a linear laser beam in the longitudinal direction can be located outside a device area, slight blurring causes no influence on the processing. On the other hand, since both end portions in the width direction are not blurred at all, no adverse influence is caused even if they are applied to the device area.

In this embodiment, since n=3, the number of divided laser beams in the vertical direction (width direction of a linear beam) is determined by a multiple of (3−1). Specifically, N is set at 4 and the division number is set at 8. The number of divided laser beams in the horizontal direction (longitudinal direction of a linear beam) is (2·3+1)=7.

The reason why the optical systems of FIGS. 2 and 5 are used is they can convert the beam shape into a linear shape while averaging the energy unevenness existing in a beam before entrance to the optical system by dividing the beam and then superimposing the divided beams.

All linear laser beams used in the invention are basically the same as a beam obtained by the optical system of FIG. 5. The roles of the lenses shown in FIG. 5 will be described below.

The cylindrical lens groups 202 and 203 have roles of dividing a beam in the horizontal and vertical directions.

The cylindrical lenses 204 and 501 have roles of combining the divided laser beams.

In this embodiment, an original beam is divided into eight beams in the vertical direction (width direction of a linear laser beam) and into seven beams in the horizontal direction (longitudinal direction of a linear laser beam).

Therefore, a linear laser beam is obtained by combining 56 divided beams into a single beam. The beam energy profile is averaged in this manner.

Although the beam aspect ratio is variable from the viewpoint of the configuration of the optical system, easy-to-form beam shapes are restricted by the sizes of the lenses and the combination of the focal lengths. It is noted that the optical system being considered cannot change the longitudinal length of a beam.

This embodiment is effective with either of the lens arrangement of FIG. 8A or that of FIG. 8B. However, it is more effective with the arrangement of FIG. 8B.

Although the cylindrical lens group 202 and the cylindrical lens group 203 are convex lens groups, they may be concave lens groups or concave/convex-mixed lens groups. A laser beam may be divided by a method other than the method using cylindrical lenses.

Figure 11A:
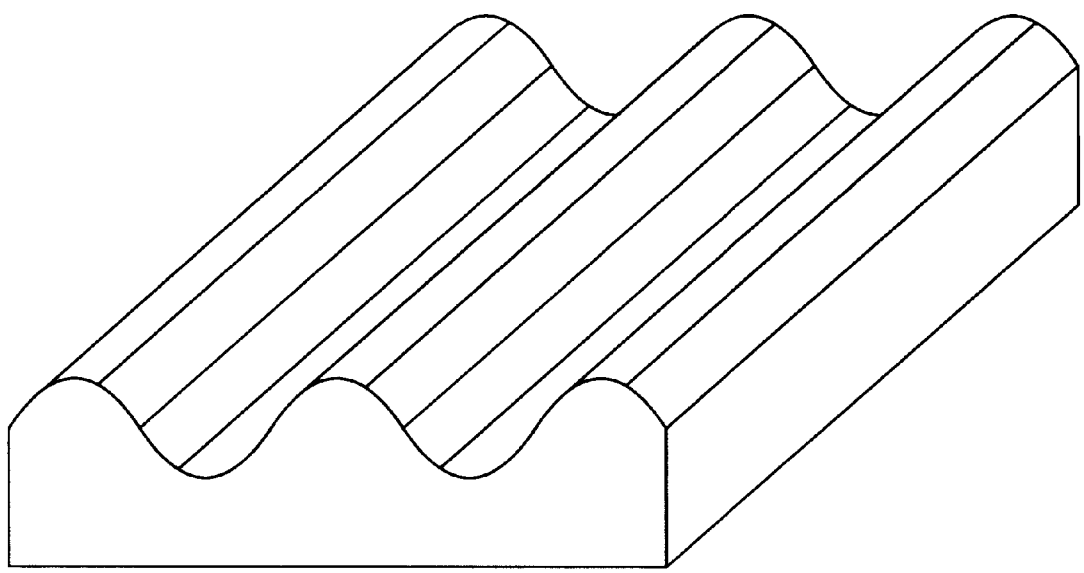
FIGS. 11A and 11B show examples of a concave/convex-mixed cylindrical lens group and a multi-phase lens, respectively.
Figure 11B:
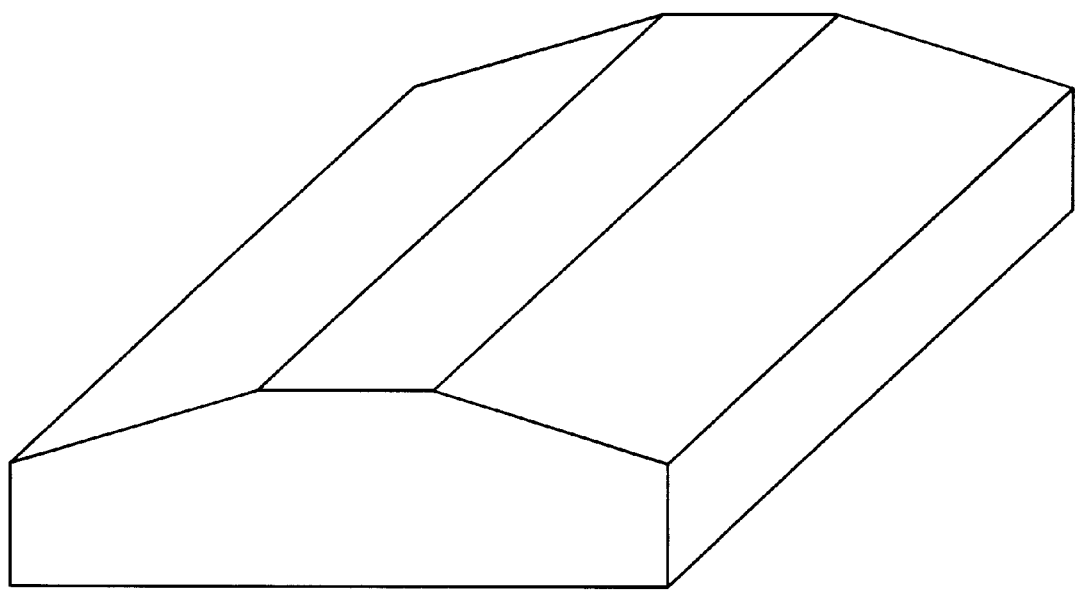
Figure 14:
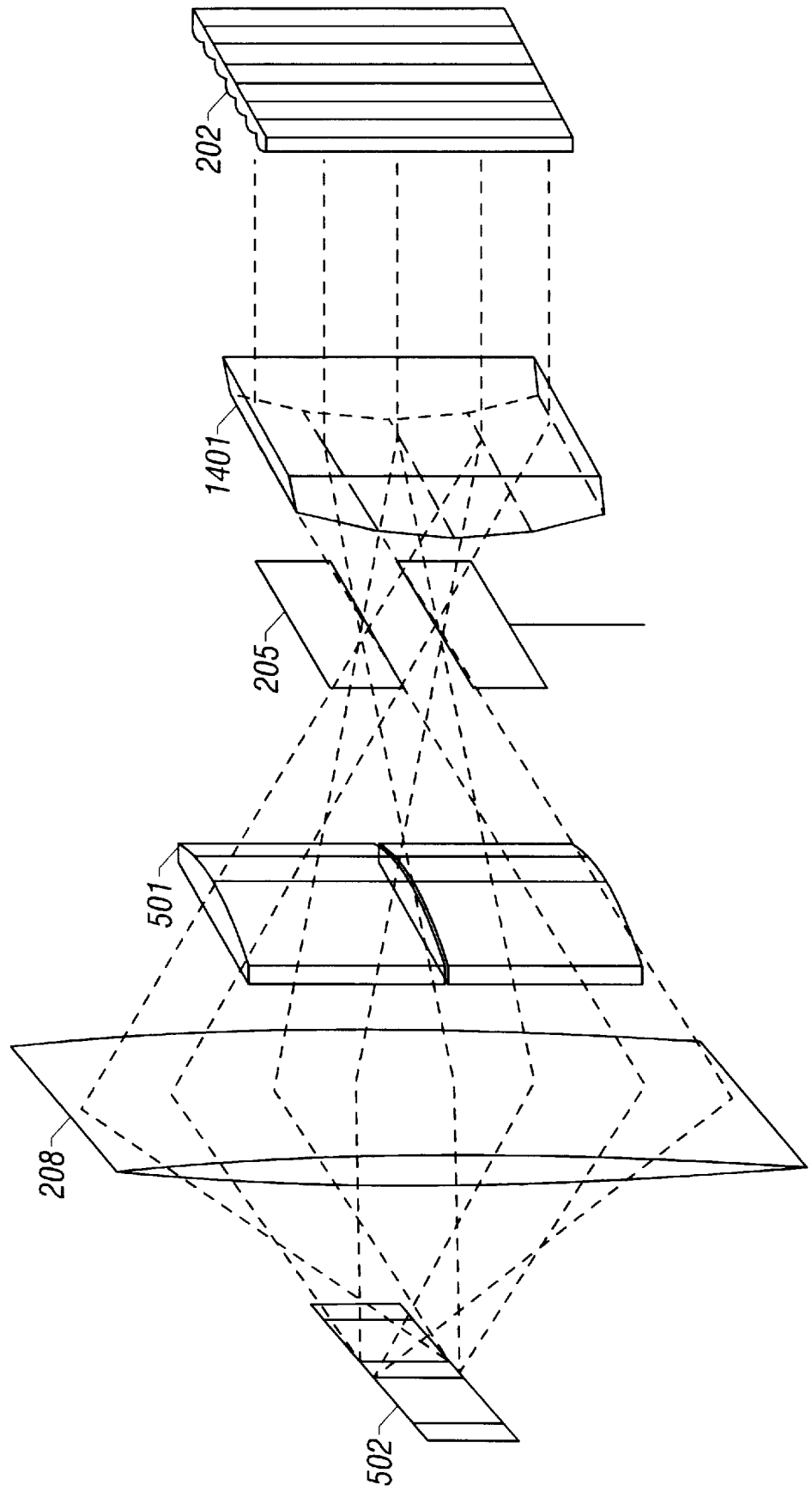
FIG. 14 shows an optical system for forming a linear laser beam according to the first embodiment and an optical path thereof.
Figure 9:
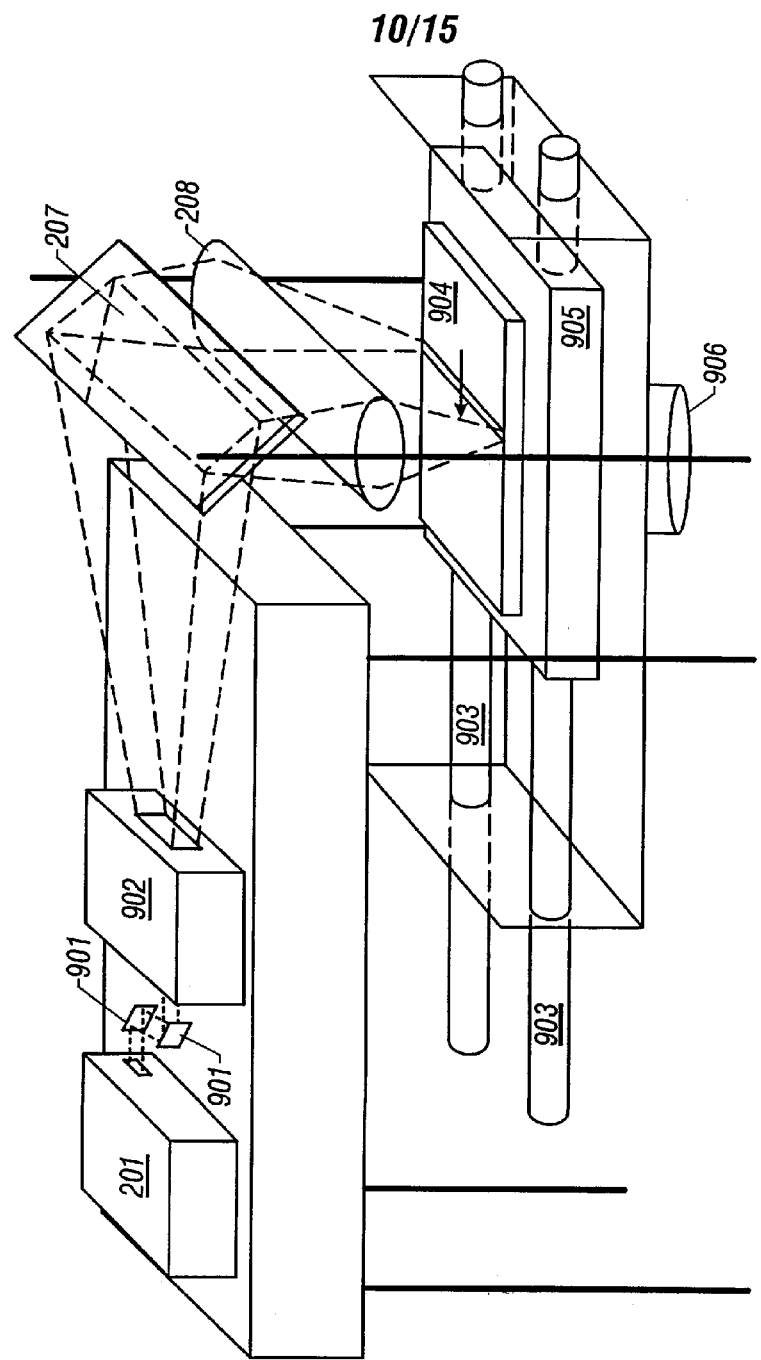

For example, FIG. 11A shows a concave/convex-mixed lens group having approximately the same function as the cylindrical lens group 202 shown in FIG. 5 and hence is replaceable with the latter. Or the cylindrical lens group 203 and the cylindrical lens 204 shown in FIG. 5 may be replaced by multi-phase lenses having approximately the same functions (see FIG. 11B). By disposing a multi-phase lens 1401 as shown in FIG. 14, approximately the same beam as obtained by the optical system of FIG. 6 can be formed.

Further, the cylindrical lens 208 may be replaced by a multi-phase lens or a lens constituted of a plurality of cylindrical lenses.

Where a lens whose constituent lenses are not congruous with each other as typified by a concave/convex-mixed lens is used, it is preferable that the constituent lenses be configured so as to produce parallel beams having the same divergence angle. Otherwise, when divided beams are recombined together, they are superimposed one on another in a state that the individual beams have different sizes and shapes, as a result of which the beam outline becomes unclear.

A XeCl excimer laser (wavelength: 308 nm) is used as the laser oscillation device 201. A KrF excimer laser (wavelength: 248 nm) and the like may also be used.

A substrate 904 to be processed is mounted on a stage 905. The stage 905 is moved straightly by a moving mechanism 903 in the direction that is perpendicular to the longitudinal direction of a linear laser beam and is included in the plane of the linear laser beam, to make it possible to apply the linear laser beam to the top surface of the substrate 904 while scanning it with the linear laser beam (see FIG. 9).

Figure 10:
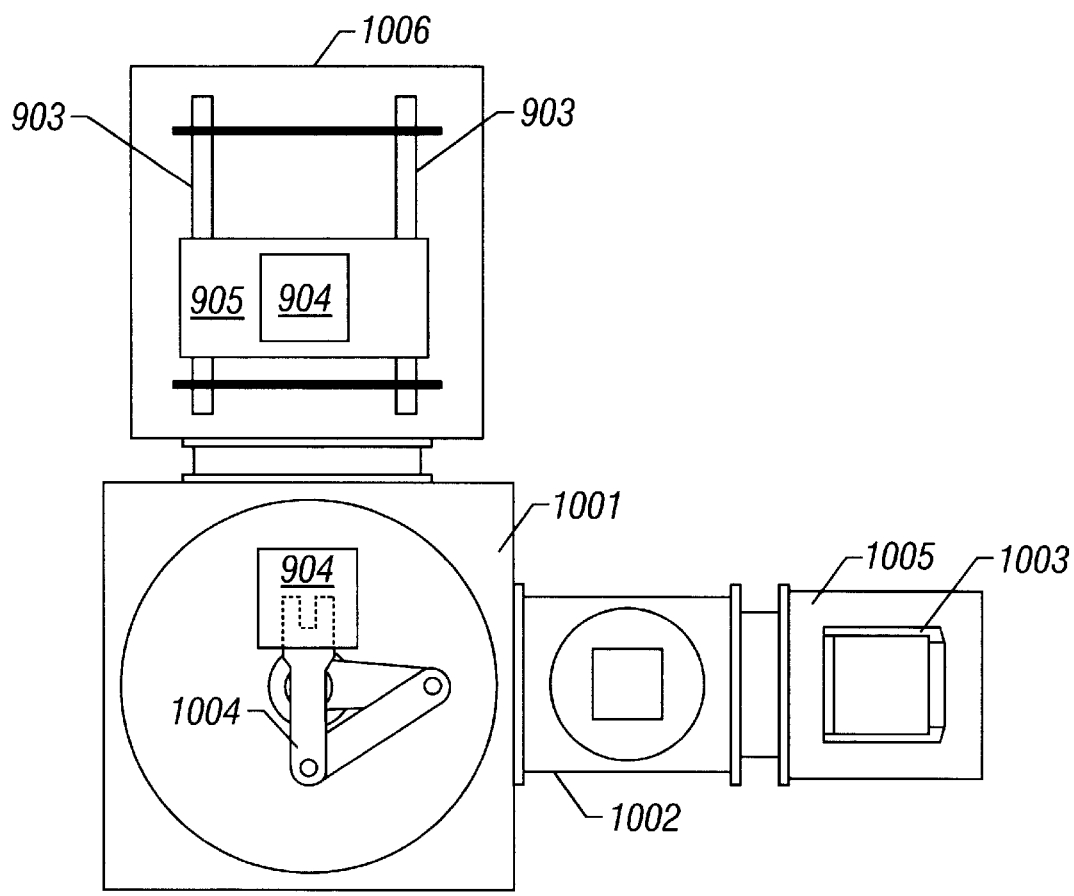
FIG. 10 is a top view of a laser annealing apparatus according to the first embodiment.

An apparatus shown in FIG. 10 will be described below. A cassette 1003 accommodating a number of, for instance, 20, substrates 904 to be processed is placed in a load/unload chamber 1005. One substrate 904 is moved from the cassette 1003 to an alignment chamber 1002 by a robot arm 1004.

The alignment chamber 1002 is equipped with an alignment mechanism for correcting the positional relationship between the substrate 904 and the robot arm 1004. The alignment chamber 1002 is connected to the load/unload chamber 1005.

The substrate 904 is carried to a substrate transport chamber 1001 by the robot arm 1004, and then moved to a laser illumination chamber 1006 by the robot arm 1004.

Referring to FIG. 9, the width and the length of a linear laser beam that is applied to the substrate 904 to be processed are set at 0.4 mm and 135 mm, respectively. The linear laser beam is formed by the lens arrangement of FIG. 5 in which the cylindrical lens group 203 is constituted of eight lenses.

The energy density of a laser beam on the illumination surface is set in a range of 100–500 mJ/cm$^2$, for instance, 300 mJ/cm$^2$. The illumination surface is scanned with a linear laser beam while the stage 905 is moved in one direction at 1.2 mm/s. The oscillation frequency of the laser oscillation device 201 is set at 30 Hz. As a result, one point on the illumination surface is illuminated with 10 shots of laser beams. The number of shots is selected in a range of 5 to 50.

After completion of the laser illumination, the substrate 904 is returned to the substrate transport chamber 1001 by the robot arm 1004. Then, the substrate 904 is moved to the load/unload chamber 1005 and caused to be accommodated in the cassette 1003 by the robot arm 1004.

The laser annealing step is thus finished. By repeating the above step, a number of substrates 904 can be processed consecutively one by one.

Although a linear laser beam is used in this embodiment, the invention is effective even if any beam shape is employed that ranges from a linear shape to a square shape.

Either an n-channel TFT or a p-channel TFT can be manufactured by using, as an active layer, a semiconductor film formed by the above laser annealing. It is also possible to manufacture a structure that is a combination of an n-channel TFT and a p-channel TFT. Further, an electronic circuit can be constructed by integrating a number of TFTs.

The above also applies to semiconductor films formed by laser annealing that uses an optical system of any of the other embodiments. Where a TFT liquid crystal display device is manufactured by using a semiconductor film formed by laser annealing that uses the optical system of the invention, it can produce high-quality images by virtue of small variations in the characteristics of the respective TFTs.

Embodiment 2

If a striped pattern cannot be eliminated properly in the first embodiment, it means that the arrangement of the optical system or the manner of superposition of laser beams is inappropriate. In this case, a scanning direction that makes an interference fringe less conspicuous may be selected by finely adjusting the substrate scanning direction with a scanning direction changing device 906 (see FIG. 9).

That is, an adjustment is so made that scanning with a linear laser beam is performed in a direction that forms a small angle with the width direction of the linear laser beam.

Embodiment 3

Where the optical system arrangement shown in FIG. 8B is employed in the first embodiment, the pitch of an interference fringe can easily be derived through a calculation. This embodiment is directed to a calculation method therefor. First, the following consideration is made with an assumption that the constituent lenses of the cylindrical lens 501 are not deviated from each other. Such a cylindrical lens 501 is now called a cylindrical lens 1206.

FIGS. 8A and 8B may be regarded as sectional views including the cylindrical lens group 202 shown in FIG. 5 and the cylindrical lens 501.

Where the optical system of FIG. 8B is employed, beams to be combined by the cylindrical lens 1206 can be said to be plane waves.

Figure 12:
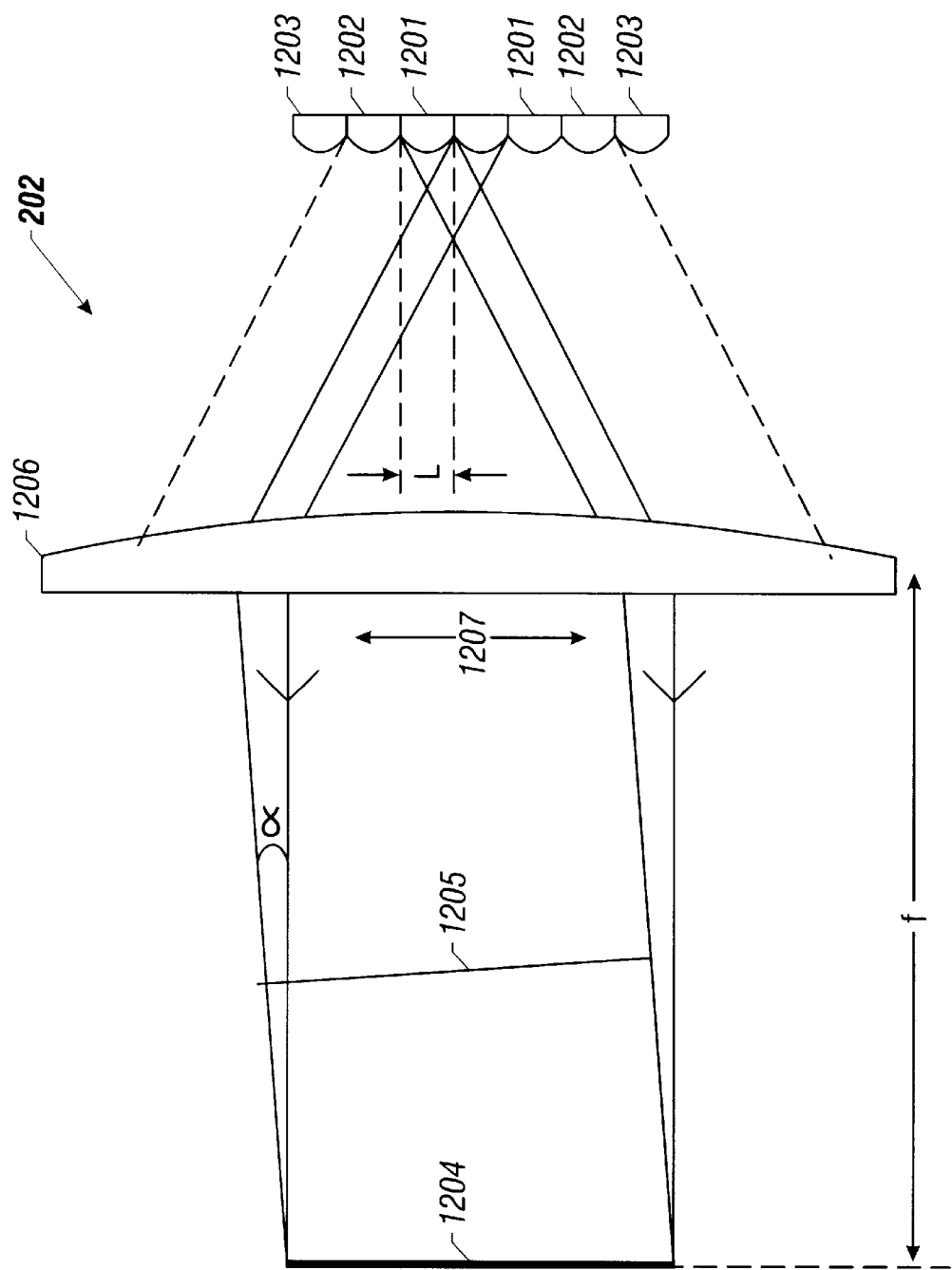
FIGS. 12 and 13 show parameters that are necessary for determining the pitch d of an interference fringe through a calculation.

In this case, as shown in FIG. 12, laser beams that enter the cylindrical lens 1206 after passing through two respective lenses 1201 adjacent to the central lens among the lenses constituting the cylindrical lens group 202 intersect the illumination surface 1204 at an angle $\alpha$.

Figure 13:
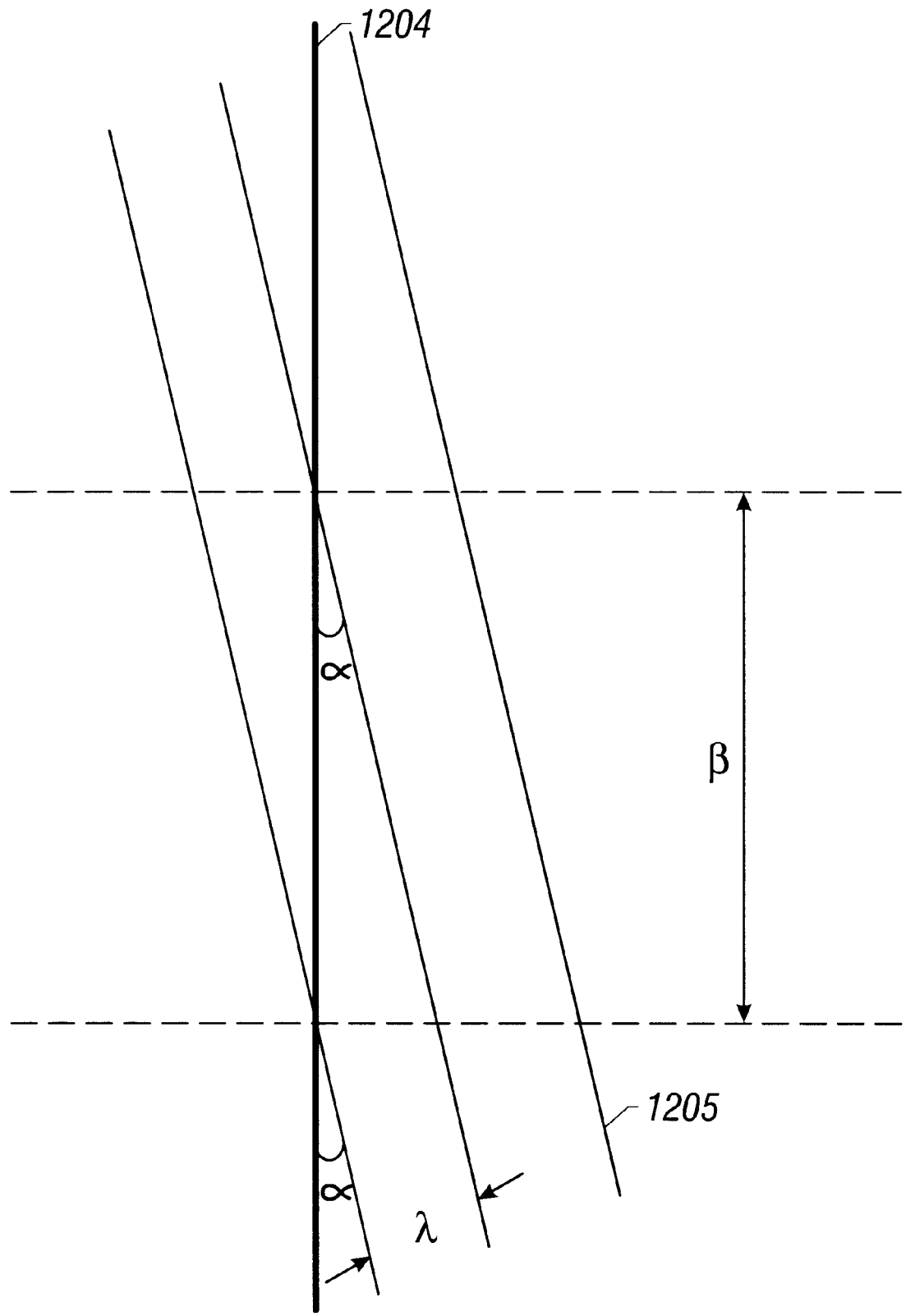

Since a wave surface 1205 of a laser beam assumes a straight line in FIG. 12, straight lines representing wave surfaces that are drawn at intervals of a wavelength intersect the illumination surface 1204 at points having intervals $\beta$ (see FIG. 13).

The relationship between the angle $\alpha$ and the intervals $\beta$ can be expressed by a formula including the wavelength $\lambda$, that is, $\beta = \lambda/\sin \alpha$.

The two lenses 1201 form stationary waves having the interval $\beta$ on the illumination surface 1204. Two lenses 1202 form stationary waves having an interval $\beta/2$ on the illumination surface 1204. Further, Two lenses 1203 form stationary waves having an interval $\beta/3$ on the illumination surface 1204. Those stationary waves are combined on the illumination surface 1204 into a stationary wave as shown in FIG. 4A. Therefore, the interval $\beta$ coincides with the interval d between interference peaks shown in FIGS. 4A–4B and 7A–7G. This is understood by a simple calculation.

A simple calculation shows that even if the position of the cylindrical lens 1206 is moved with respect to the cylindrical lens group 202 in a direction of arrow 1207 (i.e., the right-left direction), almost no variation occurs in the interval d. This indicates that moving the constituent lenses of the cylindrical lens 501 in the right or left direction in returning the cylindrical lens 1206 to the cylindrical lens 501 does not influence the essence of the invention at all.

A relationship $\tan \alpha = L/f$ holds where f is the focal length of the cylindrical lens 1206 and L is the width of each constituent lens of the cylindrical lens group 202.

Since the angle $\alpha$ is sufficiently small, a relationship $\tan \alpha \approx \sin \alpha$. Therefore, a formula $\beta \approx \lambda f/L$ is obtained.

Since the relationship $\beta = d$ generally holds as described above, d is approximately given by $\lambda f/L$.

Thus, the length of one period d of interference peaks appearing in a beam that is output from one constituent lens of the cylindrical lens 501 shown in FIG. 5 can be determined without the need for conducting an actual measurement if the focal length f of the cylindrical lens 1206, the width L of each constituent lens of the cylindrical lens group 202, and the wavelength $\lambda$ of the laser beam.

Where the optical system arrangement of FIG. 8A is employed, beams that are output from the cylindrical lens 501 are spherical lens and hence the above-obtained formula does not hold completely.

In this case, the value of d needs to be calculated through a numerical calculation using a computer.

However, if the sum of the focal length f of the cylindrical lens 501 and the focal length of the cylindrical lens group 202 is close to the interval between the cylindrical lens 501 and the cylindrical lens group 202, a value of d obtained by the above formula can be used.

Embodiment 4

This embodiment is directed to a case of manufacturing a TFT by using a polysilicon film formed by the above method.

A polysilicon film formed by the above method is patterned into an active layer pattern on a TFT. A channel forming region and high-resistivity regions will be formed in the active layer pattern. After the formation of the active layer, a 100-nm-thick silicon oxide film as a gate insulating film is formed by plasma CVD.

Thereafter, a 400-nm-thick titanium film is formed by sputtering and then patterned into a gate electrode. A 200-nm-thick anodic oxide film is formed on the exposed surface of the titanium film pattern.

The anodic oxide film has a function of protecting the surface of the gate electrode electrically and physically as well as a function of forming high-resistivity regions called offset regions adjacent to the channel forming region in a later step.

Then, phosphorus doping is performed by using the gate electrode and the anodic oxide film around it as a mask. Phosphorus serves as a dopant for source and drain regions.

Source and drain regions are formed in a self-aligned manner by the phosphorus doping. Phosphorus is introduced at a dose of $5 \times 10^{14}$ ions/cm$^2$ by using an ion doping apparatus. Phosphorus is activated by illuminating the active layer with laser light by the method of the first embodiment. The laser beam energy density is set at 200 mJ/cm$^2$. The appropriate energy density in this step depends on the kind of laser, the illumination method, and the state of a semiconductor film. Therefore, the energy density should be adjusted to those factors. The laser illumination decreased the sheet resistance of the source and drain regions to 1 kΩ/□.

Then, a 150-nm-thick silicon nitride film as an interlayer insulating film is formed by plasma CVD and an acrylic resin film is formed thereon. The acrylic resin film is formed so as to have a minimum thickness of 700 nm. The resin film is used to planarize the surface.

Examples of usable materials other than acrylic are polyimide, polyamide, polyimideamide, and epoxy. The resin film may be a multilayered film.

Then, after contact holes are formed, a source electrode and a drain electrode are formed. An n-channel TFT is thus completed. Although in this embodiment the n-channel TFT is manufactured because phosphorus is introduced into the source and drain regions, to manufacture a p-channel TFT the source and drain regions may be doped with boron instead of phosphorus.

When a liquid crystal display device, for instance, was manufactured by using TFTs that were formed according to the invention, traces of the laser processing were less conspicuous than in conventional cases.

As described above, the invention can greatly improve the intraplane uniformity of the effect of laser annealing that uses a laser beam that has been uniformized by dividing an original beam and recombining the divided beams.

What is claimed is:

1. A laser illumination method comprising the steps of:
   causing a laser beam to pass through an optical system comprising:
      an optical lens for dividing the laser beam into N(n'−1) beams in a vertical direction;
      a cylindrical lens group for dividing the laser beam into (2n+1) beams in a horizontal direction;
      (n'−1) cylindrical lenses for recombining the beams that are divided in the horizontal direction while superimposing the divided beams so that they are deviated from each other by d/(n'−1) in the horizontal direction; and
      a cylindrical lens for recombining the beams that are divided in the vertical direction; and
   illuminating an illumination surface with the laser beam that is output from the optical system,
   wherein d is defined as an interval of peaks of an interference fringe that is formed on the illumination surface by a beam that has passed through one of the (n'−1) cylindrical lenses and
   wherein N is a natural number, n is an integer that is greater than or equal to 3, and n' is an integer that satisfies 3≦n'≦n.

2. A laser illumination method comprising the steps of:
   causing a laser beam to pass through an optical system comprising:
      an optical lens for dividing the laser beam into N(n−1) beams in a vertical direction;
      a cylindrical lens group for dividing the laser beam into (2n+1) beams in a horizontal direction;
      (n−1) cylindrical lenses for recombining the beams that are divided in the horizontal direction while superimposing the divided beams so that they are deviated from each other by d/(n−1) in the horizontal direction; and
      a cylindrical lens for recombining the beams that are divided in the vertical direction; and
   illuminating an illumination surface with the laser beam that is output from the optical system,
   wherein d is defined as an interval of peaks of an interference fringe that is formed on the illumination surface by a beam that has passed through one of the (n−1) cylindrical lenses and
   wherein N is a natural number, n is an integer that is greater than or equal to 3.

3. A laser illumination method comprising the steps of:
   causing a laser beam to pass through an optical system comprising:
      an optical lens for dividing the laser beam into N(n'−1) beams in a vertical direction;
      a cylindrical lens group for dividing the laser beam into (2n) beams in a horizontal direction;
      (n'−1) cylindrical lenses for recombining the beams that are divided in the horizontal direction while superimposing the divided beams so that they are deviated from each other by d/(n'−1) in the horizontal direction; and
      a cylindrical lens for recombining the beams that are divided in the vertical direction; and
   illuminating an illumination surface with the laser beam that is output from the optical system,
   wherein d is defined as an interval of peaks of an interference fringe that is formed on the illumination surface by a beam that has passed through one of the (n'−1) cylindrical lenses and
   wherein N is a natural number, n is an integer that is greater than or equal to 3, and n' is an integer that satisfies 3≦n'≦n.

4. A laser illumination method comprising the steps of:
   causing a laser beam to pass through an optical system comprising:
      an optical lens for dividing the laser beam into N(n−1) beams in a vertical direction;
      a cylindrical lens group for dividing the laser beam into (2n) beams in a horizontal direction;
      (n−1) cylindrical lenses for recombining the beams that are divided in the horizontal direction while superimposing the divided beams so that they are deviated from each other by d/(n−1) in the horizontal direction; and
      a cylindrical lens for recombining the beams that are divided in the vertical direction; and
   illuminating an illumination surface with the laser beam that is output from the optical system, wherein d is defined as an interval of peaks of an interference fringe that is formed on the illumination surface by a beam that has passed through one of the (n−1) cylindrical lenses and wherein N is a natural number, n is an integer that is greater than or equal to 3.

5. The laser illumination method according to claim 1, wherein on the illumination surface the laser beam is a linear beam having a longer axis in the horizontal direction.

6. The laser illumination method according to claim 2, wherein on the illumination surface the laser beam is a linear beam having a longer axis in the horizontal direction.

7. The laser illumination method according to claim 3, wherein on the illumination surface the laser beam is a linear beam having a longer axis in the horizontal direction.

8. The laser illumination method according to claim 4, wherein on the illumination surface the laser beam is a linear beam having a longer axis in the horizontal direction.

9. The laser illumination method according to claim 1, wherein the laser beam is applied to a semiconductor film.

10. The laser illumination method according to claim 2, wherein the laser beam is applied to a semiconductor film.

11. The laser illumination method according to claim 3, wherein the laser beam is applied to a semiconductor film.

12. The laser illumination method according to claim 4, wherein the laser beam is applied to a semiconductor film.

13. The laser illumination method according to claim 1, wherein d is approximately expressed by $d=\lambda f/L$, where $\lambda$ is a wavelength of the laser beam, f is a focal length of the (n'−1) cylindrical lenses, and L is a width of each constituent lens of the cylindrical lens group.

14. The laser illumination method according to claim 2, wherein d is approximately expressed by $d=\lambda f/L$, where $\lambda$ is a wavelength of the laser beam, f is a focal length of the (n−1) cylindrical lenses, and L is a width of each constituent lens of the cylindrical lens group.

15. The laser illumination method according to claim 3, wherein d is approximately expressed by $d=\lambda f/L$, where $\lambda$ is a wavelength of the laser beam, f is a focal length of the (n'−1) cylindrical lenses, and L is a width of each constituent lens of the cylindrical lens group.

16. The laser illumination method according to claim 4, wherein d is approximately expressed by $d=\lambda f/L$, where $\lambda$ is a wavelength of the laser beam, f is a focal length of the (n−1) cylindrical lenses, and L is a width of each constituent lens of the cylindrical lens group.

17. A laser illumination method comprising the steps of:
causing a laser beam to pass through an optical system comprising:
  an optical lens for dividing the laser beam into N(n'−1) beams in a vertical direction;
  a cylindrical lens group for dividing the laser beam into (2n+1) beams in a horizontal direction;
  (n'−1) cylindrical lenses for recombining the beams that are divided in the horizontal direction while superimposing the divided beams so that they are deviated from each other by d/(n'−1) in the horizontal direction; and
  a cylindrical lens for recombining the beams that are divided in the vertical direction; and
  illuminating an illumination surface with the laser beam that is output from the optical system,
wherein d is defined as an interval of peaks of an interference fringe that is formed on the illumination surface by a beam that has passed through one of the (n−1) cylindrical lenses;
wherein N is a natural number, n is an integer that is greater than or equal to 3, and n' is an integer that satisfies $3 \leq n' \leq n$; and
wherein sum of a focal length of the cylindrical lens group and a focal length of the (n'−1) cylindrical lenses is approximately equal to an interval between the cylindrical lens group and the (n'−1) cylindrical lenses.

18. A laser illumination method comprising the steps of:
causing a laser beam to pass through an optical system comprising:
  an optical lens for dividing the laser beam into N(n−1) beams in a vertical direction;
  a cylindrical lens group for dividing the laser beam into (2n+1) beams in a horizontal direction;
  (n−1) cylindrical lenses for recombining the beams that are divided in the horizontal direction while superimposing the divided beams so that they are deviated from each other by d/(n−1) in the horizontal direction; and
  a cylindrical lens for recombining the beams that are divided in the vertical direction; and
  illuminating an illumination surface with the laser beam that is output from the optical system,
wherein d is defined as an interval of peaks of an interference fringe that is formed on the illumination surface by a beam that has passed through one of the (n−1) cylindrical lenses;
wherein N is a natural number, n is an integer that is greater than or equal to 3; and
wherein sum of a focal length of the cylindrical lens group and a focal length of the (n−1) cylindrical lenses is approximately equal to an interval between the cylindrical lens group and the (n−1) cylindrical lenses.

19. A laser illumination method comprising the steps of:
causing a laser beam to pass through an optical system comprising:
  an optical lens for dividing the laser beam into N(n'−1) beams in a vertical direction;
  a cylindrical lens group for dividing the laser beam into (2n) beams in a horizontal direction:
  (n'−1) cylindrical lenses for recombining the beams that are divided in the horizontal direction while superimposing the divided beams so that they are deviated from each other by d/(n'−1) in the horizontal direction; and
  a cylindrical lens for recombining the beams that are divided in the vertical direction; and
  illuminating an illumination surface with the laser beam that is output from the optical system,
wherein d is defined as an interval of peaks of an interference fringe that is formed on the illumination surface by a beam that has passed through one of the (n−1) cylindrical lenses;
wherein N is a natural number, n is an integer that is greater than or equal to 3, and n' is an integer that satisfies $3 \leq n' < n$; and
wherein sum of a focal length of the cylindrical lens group and a focal length of the (n'−1) cylindrical lenses is approximately equal to an interval between the cylindrical lens group and the (n'−1) cylindrical lenses.

20. A laser illumination method comprising the steps of:
causing a laser beam to pass through an optical system comprising:
  an optical lens for dividing the laser beam into N(n−1) beams in a vertical direction;
  a cylindrical lens group for dividing the laser beam into (2n) beams in a horizontal direction;

(n−1) cylindrical lenses for recombining the beams that are divided in the horizontal direction while superimposing the divided beams so that they are deviated from each other by d/(n−1) in the horizontal direction; and a cylindrical lens for recombining the beams that are divided in the vertical direction; and illuminating an illumination surface with the laser beam that is output from the optical system, wherein d is defined as an interval of peaks of an interference fringe that is formed on the illumination surface by a beam that has passed through one of the (n−1) cylindrical lenses;

wherein N is a natural number, n is an integer that is greater than or equal to 3; and wherein sum of a focal length of the cylindrical lens group and a focal length of the (n−1) cylindrical lenses is approximately equal to an interval between the cylindrical lens group and the (n−1) cylindrical lenses.

21. The laser illumination method according to claim 17, wherein on the illumination surface the laser beam is a linear beam having a longer axis in the horizontal direction.

22. The laser illumination method according to claim 18, wherein on the illumination surface the laser beam is a linear beam having a longer axis in the horizontal direction.

23. The laser illumination method according to claim 19, wherein on the illumination surface the laser beam is a linear beam having a longer axis in the horizontal direction.

24. The laser illumination method according to claim 20, wherein on the illumination surface the laser beam is a linear beam having a longer axis in the horizontal direction.

25. The laser illumination method according to claim 17, wherein the laser beam is applied to a semiconductor film.

26. The laser illumination method according to claim 18, wherein the laser beam is applied to a semiconductor film.

27. The laser illumination method according to claim 19, wherein the laser beam is applied to a semiconductor film.

28. The laser illumination method according to claim 20, wherein the laser beam is applied to a semiconductor film.

29. The laser illumination method according to claim 17, wherein d is approximately expressed by d=λf/L, where λ is a wavelength of the laser beam, f is the focal length of the (n'−1) cylindrical lenses, and L is a width of each constituent lens of the cylindrical lens group.

30. The laser illumination method according to claim 18, wherein d is approximately expressed by d=λf/L, where λ is a wavelength of the laser beam, f is the focal length of the (n−1) cylindrical lenses, and L is a width of each constituent lens of the cylindrical lens group.

31. The laser illumination method according to claim 19, wherein d is approximately expressed by d=λf/L, where λ is a wavelength of the laser beam, f is the focal length of the (n'−1) cylindrical lenses, and L is a width of each constituent lens of the cylindrical lens group.

32. The laser illumination method according to claim 20, wherein d is approximately expressed by d=λf/L, where λ is a wavelength of the laser beam, f is the focal length of the (n−1) cylindrical lenses, and L is a width of each constituent lens of the cylindrical lens group.

33. The laser illumination method according to claim 17, wherein the N(n'−1) is an even number and the (n'−1) is equal to 2.

34. The laser illumination method according to claim 18, wherein the N(n−1) is an even number and the (n−1) is equal to 2.

35. The laser illumination method according to claim 19, wherein the N(n'−1) is an even number and the (n'−1) is equal to 2.

36. The laser illumination method according to claim 20, wherein the N(n−1) is an even number and the (n−1) is equal to 2.

37. A laser illumination method comprising the steps of causing a laser beam to pass through an optical system comprising:

a first cylindrical lens group for dividing the laser beam into N(n'−1) beams in a vertical direction:

a second cylindrical lens group for dividing the laser beam into (2n+1) beams in a horizontal direction;

(n'−1) cylindrical lenses for recombining the beams that are divided in the horizontal direction while superimposing the divided beams so that they are deviated from each other by d/(n'−1) in the horizontal direction; and a cylindrical lens for recombining the beams that are divided in the vertical direction; and illuminating an illumination surface with the laser beam that is output from the optical system, wherein d is defined as an interval of peaks of an interference fringe that is formed on the illumination surface by a beam that has passed through one of the (n'−1) cylindrical lenses;

wherein N is a natural number, n is an integer that is greater than or equal to 3, and n' is an integer that satisfies 3≦n'<n.

38. A laser illumination method comprising the steps of causing a laser beam to pass through an optical system comprising:

a first cylindrical lens group for dividing the laser beam into N(n−1) beams in a vertical direction;

a second cylindrical lens group for dividing the laser beam into (2n+1) beams in a horizontal direction;

(n−1) cylindrical lenses for recombining the beams that are divided in the horizontal direction while superimposing the divided beams so that they are deviated from each other by d/(n−1)in the horizontal direction; and a cylindrical lens for recombining the beams that are divided in the vertical direction; and illuminating an illumination surface with the laser beam that is output from the optical system, wherein d is defined as an interval of peaks of an interference fringe that is formed on the illumination surface by a beam that has passed through one of the (n−1) cylindrical lenses and wherein N is a natural number, n is an integer that is greater than or equal to 3.

39. A laser illumination method comprising the steps of:

causing a laser beam to pass through an optical system comprising:

a first cylindrical lens group for dividing the laser beam into N(n'−1) beams in a vertical direction;

a second cylindrical lens group for dividing the laser beam into (2n) beams in a horizontal direction;

(n'−1) cylindrical lenses for recombining the beams that are divided in the horizontal direction while superimposing the divided beams so that they are deviated from each other by d/(n'−1)in the horizontal direction; and a cylindrical lens for recombining the beams that are divided in the vertical direction; and illuminating an illumination surface with the laser beam that is output from the optical system, wherein d is defined as an interval of peaks of an interference fringe that is formed on the illumination surface by a beam that has passed through one of the (n'−1) cylindrical lenses and wherein N is a natural number, n is an integer that is greater than or equal to 3, and n' is an integer that satisfies $3 \leq n' < n$.

40. A laser illumination method comprising the steps of causing a laser beam to pass through an optical system comprising:

- a first cylindrical lens group for dividing the laser beam into N(n−1) beams in a vertical direction;
- a second cylindrical lens group for dividing the laser beam into (2n) beams in a horizontal direction;
- (n−1) cylindrical lenses for recombining the beams that are divided in the horizontal direction while superimposing the divided beams so that they are deviated from each other by d/(n−1) in the horizontal direction; and
- a cylindrical lens for recombining the beams that are divided in the vertical direction; and
- illuminating an illumination surface with the laser beam that is output from the optical system, wherein d is defined as an interval of peaks of an interference fringe that is formed on the illumination surface by a beam that has passed through one of the (n−1) cylindrical lenses and wherein N is a natural number, n is an integer that is greater than or equal to 3.

41. The laser illumination method according to claim 37, wherein on the illumination surface the laser beam is a linear beam having a longer axis in the horizontal direction.

42. The laser illumination method according to claim 38, wherein on the illumination surface the laser beam is a linear beam having a longer axis in the horizontal direction.

43. The laser illumination method according to claim 39, wherein on the illumination surface the laser beam is a linear beam having a longer axis in the horizontal direction.

44. The laser illumination method according to claim 40, wherein on the illumination surface the laser beam is a linear beam having a longer axis in the horizontal direction.

45. The laser illumination method according to claim 37, wherein the laser beam is applied to a semiconductor film.

46. The laser illumination method according to claim 38, wherein the laser beam is applied to a semiconductor film.

47. The laser illumination method according to claim 39, wherein the laser beam is applied to a semiconductor film.

48. The laser illumination method according to claim 40, wherein the laser beam is applied to a semiconductor film.

49. The laser illumination method according to claim 37, wherein d is approximately expressed by $d = \lambda f / L$, where $\lambda$ is a wavelength of the laser beam, f is the focal length of the (n'−1) cylindrical lenses, and L is a width of each constituent lens of the second cylindrical lens group.

50. The laser illumination method according to claim 38, wherein d is approximately expressed by $d = \lambda f / L$, where $\lambda$ is a wavelength of the laser beam, f is the focal length of the (n−1) cylindrical lenses, and L is a width of each constituent lens of the second cylindrical lens group.

51. The laser illumination method according to claim 39, wherein d is approximately expressed by $d = \lambda f / L$, where $\lambda$ is a wavelength of the laser beam, f is the focal length of the (n'−1) cylindrical lenses, and L is a width of each constituent lens of the second cylindrical lens group.

52. The laser illumination method according to claim 40, wherein d is approximately expressed by $d = \lambda f / L$, where $\lambda$ is a wavelength of the laser beam, f is the focal length of the (n−1) cylindrical lenses, and L is a width of each constituent lens of the second cylindrical lens group.

53. The laser illumination method according to claim 37, wherein the N(n'−1) is an even number and the (n'−1) is equal to 2.

54. The laser illumination method according to claim 38, wherein the N(n'−1) is an even number and the (n'−1) is equal to 2.

55. The laser illumination method according to claim 39, wherein the N(n'−1) is an even number and the (n'−1) is equal to 2.

56. The laser illumination method according to claim 40, wherein the N(n'−1) is an even number and the (n'−1) is equal to 2.

* * * * *

UNITED STATES PATENT AND TRADEMARK OFFICE
CERTIFICATE OF CORRECTION

PATENT NO.   : 6,002,523
DATED        : December 14, 1999
INVENTOR(S)  : Koichiro Tanaka It is certified that error appears in the above-identified patent and that said Letters Patent is hereby corrected as shown below:

<u>Drawings,</u>
Please substitute the attached FIG. 9 (Sheet 10 of 15) as shown on the attached page.

Signed and Sealed this

Thirtieth Day of July, 2002

*Attest:*

*Attesting Officer*

JAMES E. ROGAN
*Director of the United States Patent and Trademark Office*